(12) United States Patent
Huang et al.

(10) Patent No.: US 9,184,754 B2
(45) Date of Patent: Nov. 10, 2015

(54) ANALOG-TO-DIGITAL CONVERTING DEVICE AND ANALOG-TO-DIGITAL CONVERTING METHOD

(71) Applicant: MEDIATEK INC., Hsin-Chu (TW)

(72) Inventors: Yen-Chuan Huang, Hsinchu County (TW); Chih-Hong Lou, Yilan County (TW); Chi-Yun Wang, Tainan (TW); Li-Han Hung, Taipei (TW); Min-Hua Wu, Taipei (TW)

(73) Assignee: MEDIATEK INC., Science-Based Industrial Park, Hsin-Chu (TW)

( * ) Notice: Subject to any disclaimer, the term of this patent is extended or adjusted under 35 U.S.C. 154(b) by 0 days.

(21) Appl. No.: 14/540,041

(22) Filed: Nov. 13, 2014

(65) Prior Publication Data

US 2015/0171877 A1    Jun. 18, 2015

Related U.S. Application Data

(60) Provisional application No. 61/914,967, filed on Dec. 12, 2013.

(51) Int. Cl.
| | |
|---|---|
| *H03M 1/12* | (2006.01) |
| *H03M 1/00* | (2006.01) |
| *H03M 1/06* | (2006.01) |
| *H03M 3/00* | (2006.01) |
| *H03M 1/46* | (2006.01) |

(52) U.S. Cl.
CPC .............. *H03M 1/001* (2013.01); *H03M 1/0626* (2013.01); *H03M 1/46* (2013.01); *H03M 3/344* (2013.01); *H03M 3/37* (2013.01); *H03M 3/458* (2013.01); *H03M 3/438* (2013.01)

(58) Field of Classification Search
CPC ....... H03M 3/464; H03M 3/30; H03M 1/001; H03M 3/344; H03M 1/46; H03M 1/0626; H03M 3/458; H03M 3/438

USPC .................................................. 341/143, 155
See application file for complete search history.

(56) References Cited

U.S. PATENT DOCUMENTS

| | | | |
|---|---|---|---|
| 4,467,291 A | 8/1984 | Roza | |
| 7,423,567 B2 * | 9/2008 | Melanson | ...................... 341/143 |
| 8,044,836 B2 * | 10/2011 | Zeller | ............................ 341/143 |
| 8,171,335 B2 * | 5/2012 | Tsai | ................................ 713/503 |
| 8,212,702 B2 * | 7/2012 | Lin et al. | ........................ 341/143 |
| 2005/0116850 A1 | 6/2005 | Hezar | |
| 2009/0325632 A1 | 12/2009 | Gambini | |
| 2010/0219998 A1 | 9/2010 | Oliaei | |
| 2011/0012769 A1 | 1/2011 | Ikoma | |
| 2011/0254718 A1 | 10/2011 | Matsukawa | |
| 2013/0033316 A1 | 2/2013 | Sasho | |

OTHER PUBLICATIONS

Sosio, A 2G/3G Cellular Analog Baseband Based on a Filtering ADC, IEEE Transactions on Circuits and Systems II:Express Briefs, vol. 59, No. 4, Apr. 2012.
Andersson, A 9MHz Filtering ADC with Additional 2nd-order Delta-Sigma Modulator Noise Suppression, 2013 IEEE, 2013.

* cited by examiner

*Primary Examiner* — Brian Young
(74) *Attorney, Agent, or Firm* — Winston Hsu; Scott Margo

(57) ABSTRACT

An analog-to-digital converting device includes: an integrator arranged to generate an integrating signal according to an analog input signal and a first analog feedback signal; a low-pass filter arranged to generate a first filtered signal according to the integrating signal; an analog-to-digital converter arranged to generate a digital output signal according to the first filtered signal; and a first digital-to-analog converter arranged to generate the first analog feedback signal according to the digital output signal.

95 Claims, 12 Drawing Sheets

US 9,184,754 B2

ANALOG-TO-DIGITAL CONVERTING DEVICE AND ANALOG-TO-DIGITAL CONVERTING METHOD

CROSS REFERENCE TO RELATED APPLICATIONS

This application claims the benefit of U.S. Provisional Application No. 61/914,967, which was filed on 2013 Dec. 12 and is included herein by reference.

BACKGROUND

The present invention relates to an analog-to-digital converting device and related method, and more particularly to an ADC with filtering functionality and related method.

In a wireless communication system, an analog-to-digital converter (ADC) is used to convert an analog signal into a digital signal after the RF signal is received by an antenna. However, the antenna may also receive signals other than the wanted signal at the same time. Therefore, a filter is used to filter out the unwanted signal before the signal inputting to the ADC. Normally, a filter has larger area or larger power consumption also has better filtering effect, but this also means that the filter costs higher. If a filter having bad filtering effect is employed, then the ADC should have wider dynamic range such that the unwanted signal can be suppressed by the ADC. However, the dynamic range of the ADC is inversely proportional to the supply voltage of the ADC, and the supply voltage only becomes smaller in the modern semiconductor process. Another way to increase the dynamic range of the ADC is to reduce the noise floor of the ADC. However, this method may again increase the area and power consumption of the ADC because the ADC may be designed to have large capacitor and small resistor. Therefore, providing a filtering ADC for cost/area reduction is an urgent problem in the field of wireless communication system.

SUMMARY

One of the objectives of the present embodiment is to provide a filtering ADC and related method. An advantage of the filtering ADC as compared to the conventional designs is cost/area/power consumption efficiency.

According to a first embodiment, an analog-to-digital converting device is provided. The analog-to-digital converting device comprises an integrator, a low-pass filter, an analog-to-digital converter, and a first digital-to-analog converter. The integrator is arranged to generate an integrating signal according to an analog input signal and a first analog feedback signal. The low-pass filter is arranged to generate a first filtered signal according to the integrating signal. The analog-to-digital converter is arranged to generate a digital output signal according to the first filtered signal. The first digital-to-analog converter is arranged to generate the first analog feedback signal according to the digital output signal.

According to a second embodiment, an analog-to-digital converting method is provided. The analog-to-digital converting method comprises the steps of: generating an integrating signal according to an analog input signal and an first analog feedback signal; low-pass filtering the integrating signal to generate a first filtered signal; generating a digital output signal according to the first filtered signal; and generating the first analog feedback signal according to the digital output signal.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, electronic equipment manufacturers may refer to a component by different names. This document does not intend to distinguish between components that differ in name but not function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
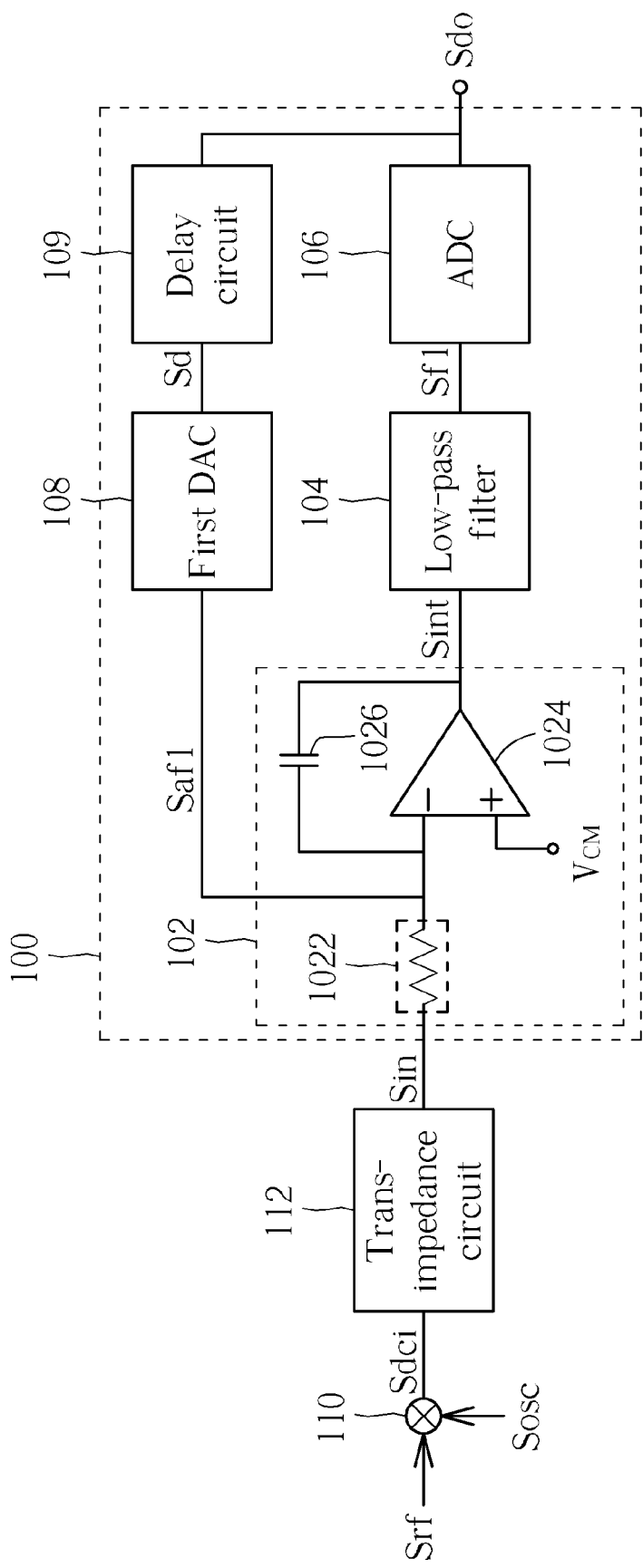
FIG. 1 is a diagram illustrating an analog-to-digital converting device according to an embodiment of the present invention.

Please refer to FIG. 1, which is a diagram illustrating an analog-to-digital converting device 100 according to an embodiment of the present invention. The analog-to-digital converting device 100 may be a filtering ADC (Filtering Analog-to-digital converter), for which a filter with analog input and digital output is available, and the filter may have fixed or variable gain depending on the design choices. The analog-to-digital converting device 100 comprises an integrator 102, a low-pass filter 104, an analog-to-digital converter (ADC) 106, and a first digital-to-analog converter (DAC) 108. The integrator 102 is arranged to generate an integrating signal Sint according to an analog input signal Sin and a first analog feedback signal Saf1. The low-pass filter 104 is arranged to generate a first filtered signal Sf1 according to the integrating signal Sint. The ADC 106 is arranged to generate a digital output signal Sdo according to the first filtered signal Sf1. The first DAC 108 is arranged to generate the first analog feedback signal Saf1 according to the digital output signal Sdo. The ADC 106 may be a flash ADC, a successive approximate ADC, a continuous-time delta-sigma ADC, or any other types of ADC.

It should be noted that a delay circuit 109 may be included to delay the digital output signal Sdo for generating a delayed digital signal Sd. Then, the first DAC 108 generates the first analog feedback signal Saf1 according to the delayed digital signal Sd.

For illustration purposes, FIG. 1 further includes a mixer 110 and a trans-impedance circuit 112. The mixer 110 is arranged to down-convert a RF signal Srf received from an antenna (not shown) into a down-converted current signal Sdci according to an oscillating signal Sosc. The trans-impedance circuit 112 is arranged to convert the down-converted current signal Sdci into the analog input signal Sin. Therefore, the analog input signal Sin is a down-converted voltage signal in this embodiment. In this embodiment, the integrator 102 comprises a resistor 1022, an operational amplifier 1024, and a capacitor 1026. The resistor 1022 has a first terminal coupled to the trans-impedance circuit 112 for receiving the analog input signal Sin. The operational amplifier 1024 has a negative input terminal (−) coupled to a second terminal of the resistor 1022, and an output terminal for outputting the integrating signal Sint. The capacitor 1026 has a first terminal coupled to the negative input terminal (−) of the operational amplifier 1024 and a second terminal coupled to the output terminal of the operational amplifier 1024. The first analog feedback signal Saf1 is feedback to the negative input terminal (−) of the operational amplifier 1024. The positive input terminal (+) of the operational amplifier 1024 is coupled to a common mode voltage Vcm of the operational amplifier 1024. The resistor 1022 may be an adjustable resistor. However, this is not a limitation of the present invention. The analog-to-digital converting device 100 may be arranged to directly receive the down-converted current signal Sdci. If the analog-to-digital converting device 100 is arranged to directly receive the down-converted current signal Sdci, then the trans-impedance circuit 112 and the resistor 1022 in FIG. 1 are discarded as shown in FIG. 2.

Figure 2:
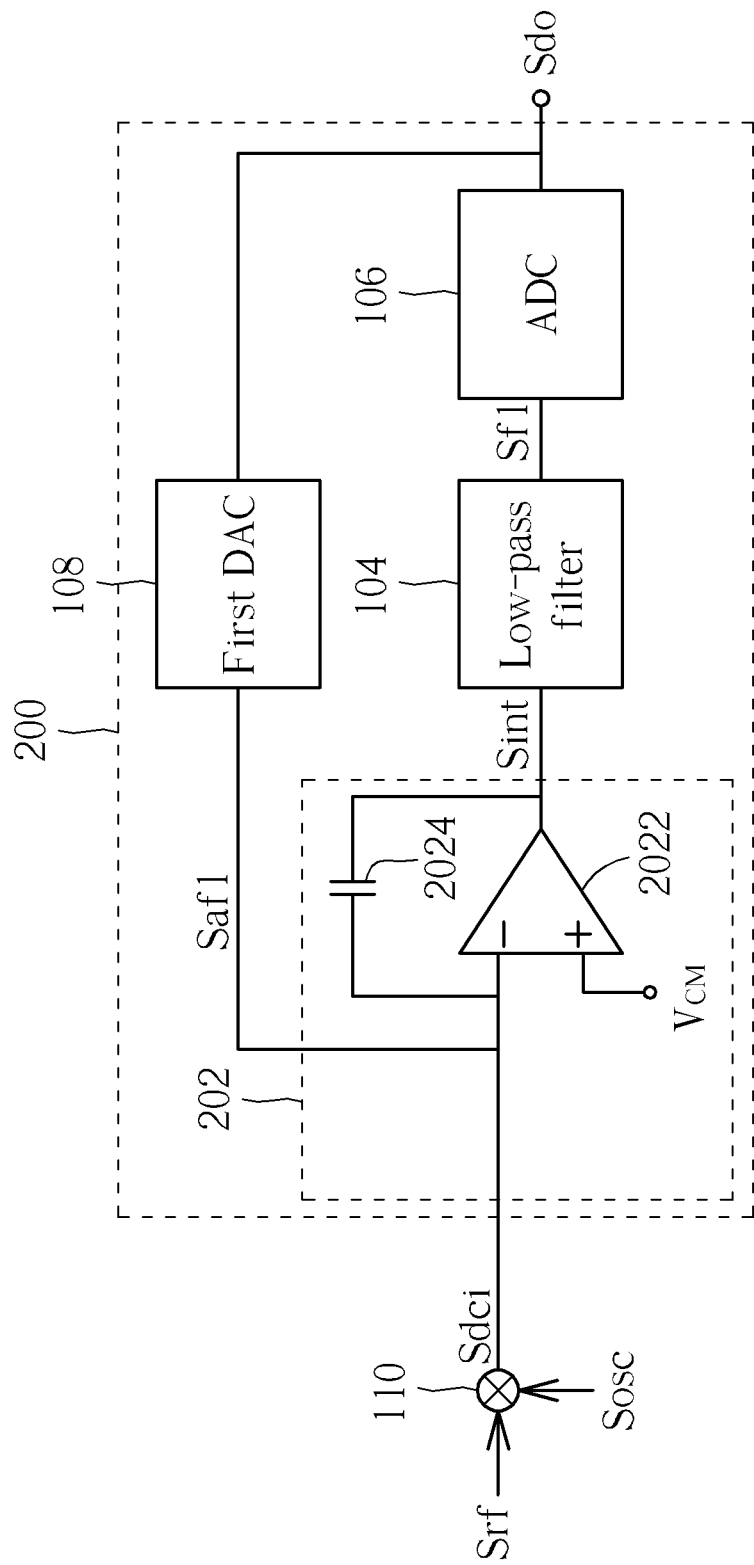
FIG. 2 is a diagram illustrating an analog-to-digital converting device according to another embodiment of the present invention.

FIG. 2 is a diagram illustrating an analog-to-digital converting device 200 according to another embodiment of the present invention. In this embodiment, the integrator 202 comprises an operational amplifier 2022 and a capacitor 2024. The capacitor 2024 is coupled between the negative input terminal (−) of the operational amplifier 2022 and the output terminal of the operational amplifier 2022. The positive input terminal (+) of the operational amplifier 2022 is coupled to the common mode voltage Vcm of the operational amplifier 2022. The down-converted current signal Sdci is directly coupled to the negative input terminal (−) of the operational amplifier 2022. The first analog feedback signal Saf1 is feedback to the negative input terminal (−) of the operational amplifier 2022.

Figure 3:
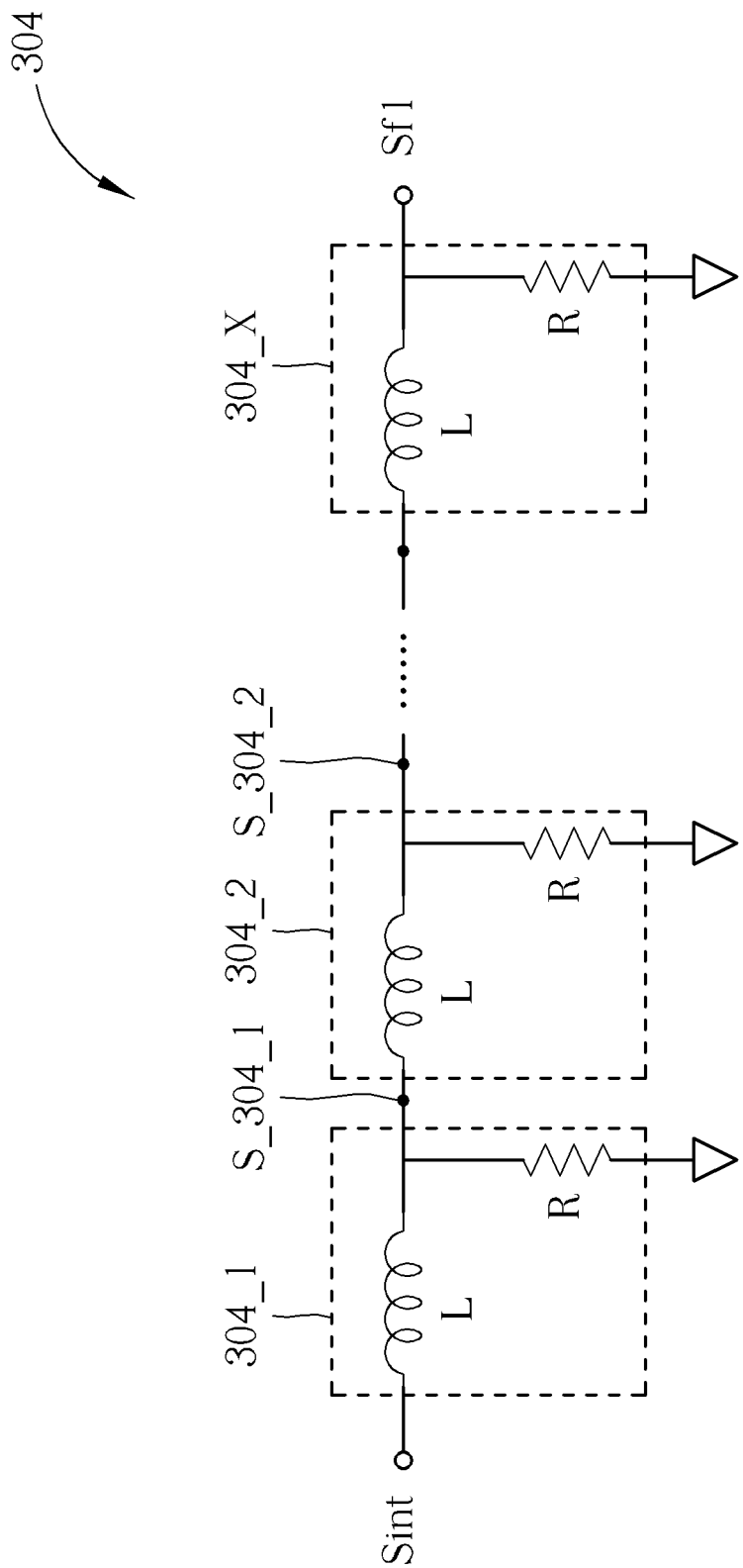
FIG. 3 is a first embodiment of a low-pass filter according to the present invention.

Please refer to FIG. 3, which is a first embodiment 304 of the low-pass filter 104 according to the present invention. The low-pass filter 304 comprises a plurality of LR (Inductor-resistor) filters 304_1-304_x, in which x is any positive integer number. The plurality of LR filters 304_1-304_x are connected in series in which the first LR filter 304_1 of the plurality of LR filters 304_1-304_x is arranged to receive the integrating signal Sint and the last LR filter 304_x of the plurality of LR filters 304_1-304_x is arranged to output the first filtered signal Sf1. Each LR filter of the plurality of LR filters 304_1-304_x comprises an inductor L and a resistor R, and the inductor L has a first terminal for receiving a pre-filtering signal and a second terminal for outputting a post-filtering signal and the resistor R has a first terminal coupled to the second terminal of the inductor L and a second terminal coupled to a reference voltage, i.e. the ground voltage Vgnd. For example, the pre-filtering signal of the first LR filter 304_1 is the integrating signal Sint, and the post-filtering signal of the first LR filter 304_1 is the signal S_304_1. The pre-filtering signal of the second LR filter 304_2 is the signal S_304_1, and the post-filtering signal of the first LR filter 304_2 is the signal S_304_2, and so on.

Figure 4:
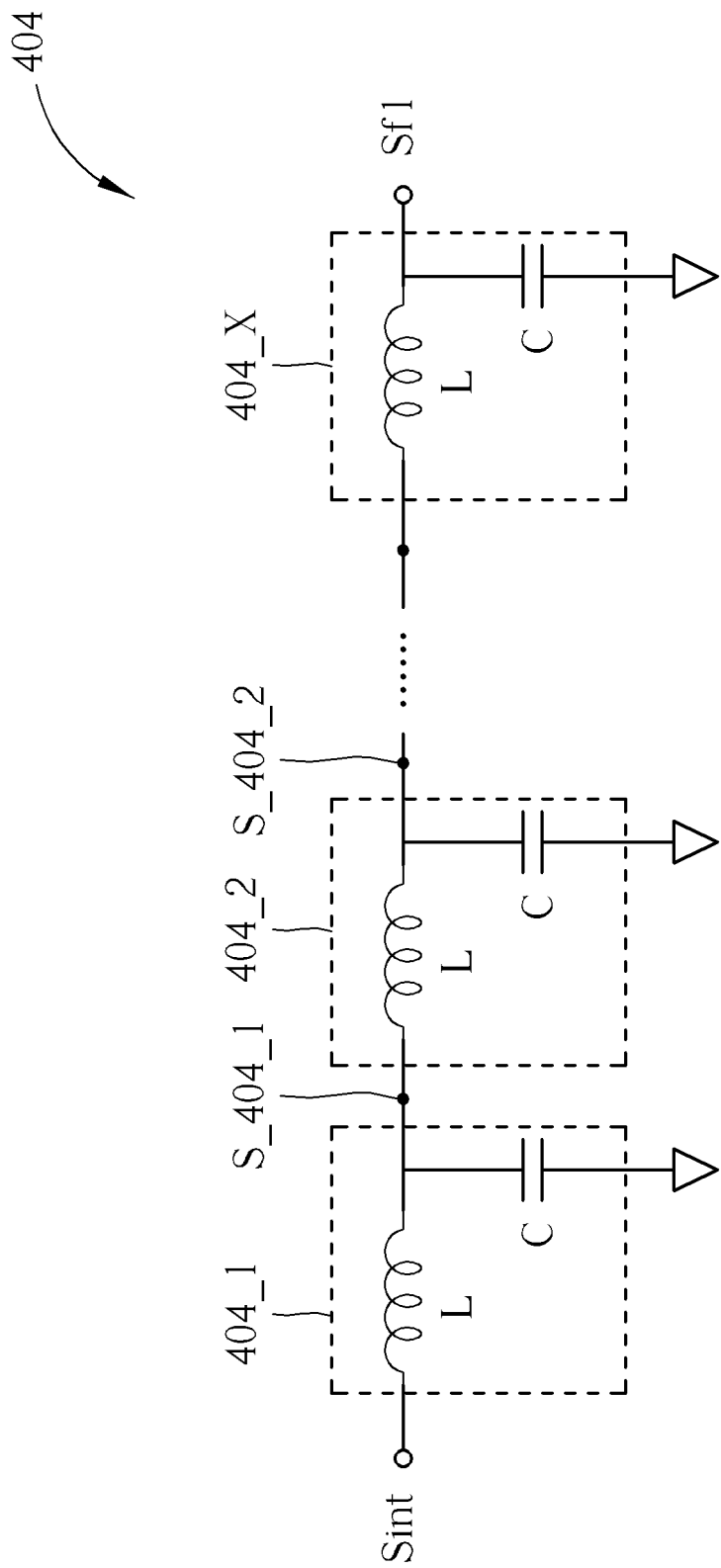
FIG. 4 is a second embodiment of the low-pass filter according to the present invention.

Please refer to FIG. 4, which is a second embodiment 404 of the low-pass filter 104 according to the present invention. The low-pass filter 404 comprises a plurality of LC (Inductor-capacitor) filters 404_1-404_x, in which x is any positive integer number. The plurality of LR filters 404_1-404_x are connected in series in which the first LC filter 404_1 of the plurality of LC filters 404_1-404_x is arranged to receive the integrating signal Sint and the last LC filter 404_x of the plurality of LC filters 404_1-404_x is arranged to output the first filtered signal Sf1. Each LC filter of the plurality of LC filters 404_1-404_x comprises an inductor L and a capacitor C, and the inductor L has a first terminal for receiving a pre-filtering signal and a second terminal for outputting a post-filtering signal and the capacitor C has a first terminal coupled to the second terminal of the inductor L and a second terminal coupled to the ground voltage Vgnd. For example, the pre-filtering signal of the first LC filter 404_1 is the integrating signal Sint, and the post-filtering signal of the first LC filter 404_1 is the signal S_404_1. The pre-filtering signal of the second LC filter 404_2 is the signal S_404_1, and the post-filtering signal of the first LC filter 404_2 is the signal S_404_2, and so on.

Figure 5:
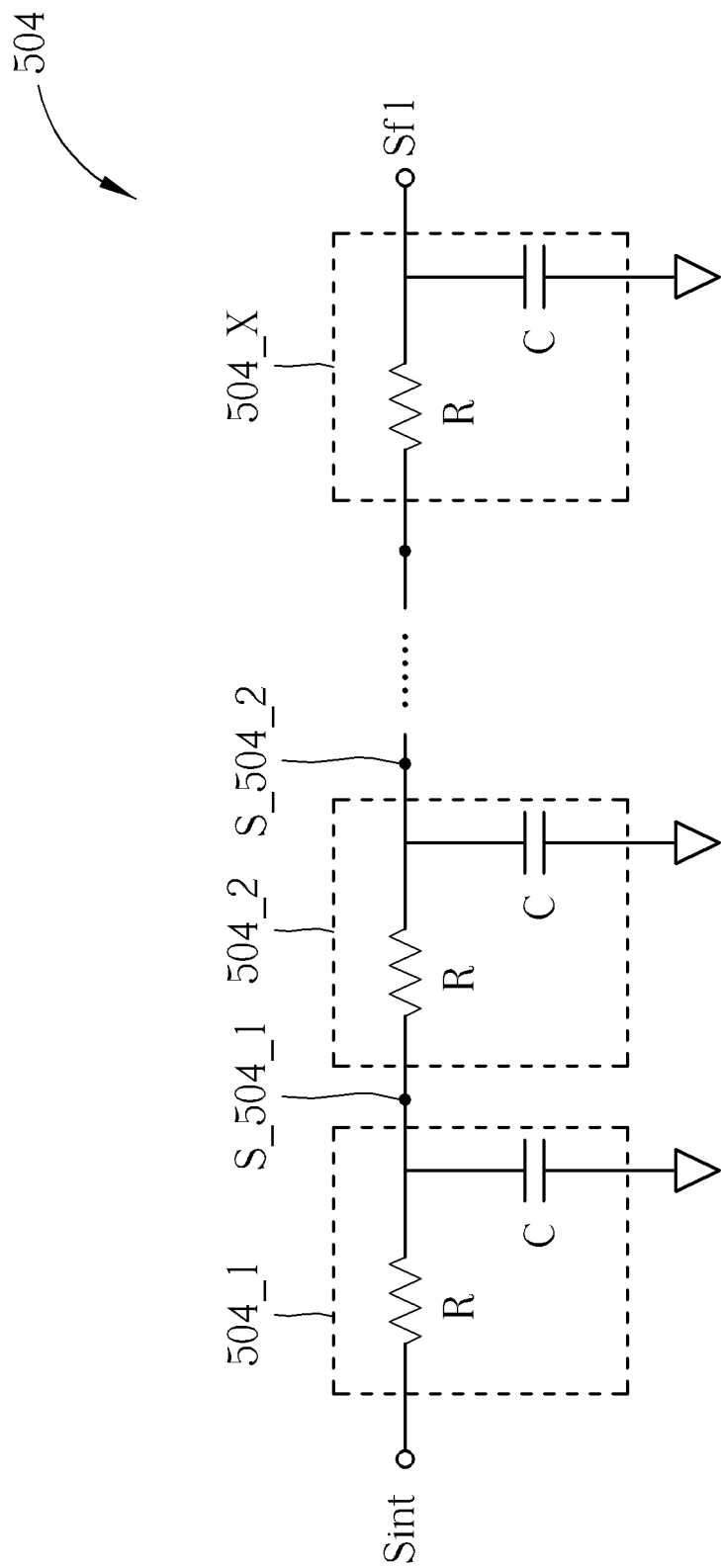
FIG. 5 is a third embodiment of the low-pass filter according to the present invention.

Please refer to FIG. 5, which is a third embodiment 504 of the low-pass filter 104 according to the present invention. The low-pass filter 504 comprises a plurality of RC (Resistor-capacitor) filters 504_1-504_x, in which x is any positive integer number. The plurality of RC filters 504_1-504_x are connected in series in which the first RC filter 504_1 of the plurality of RC filters 504_1-504_x is arranged to receive the integrating signal Sint and the last RC filter 504_x of the plurality of RC filters 504_1-504_x is arranged to output the first filtered signal Sf1. Each RC filter of the plurality of RC filters 504_1-504_x comprises an resistor R and a capacitor C, and the resistor R has a first terminal for receiving a pre-filtering signal and a second terminal for outputting a post-filtering signal and the capacitor C has a first terminal coupled to the second terminal of the resistor R and a second terminal coupled to the ground voltage Vgnd. For example, the pre-filtering signal of the first RC filter 504_1 is the integrating signal Sint, and the post-filtering signal of the first RC filter 504_1 is the signal S_504_1. The pre-filtering signal of the second RC filter 504_2 is the signal S_504_1, and the post-filtering signal of the first RC filter 504_2 is the signal S_504_2, and so on.

Figure 6:
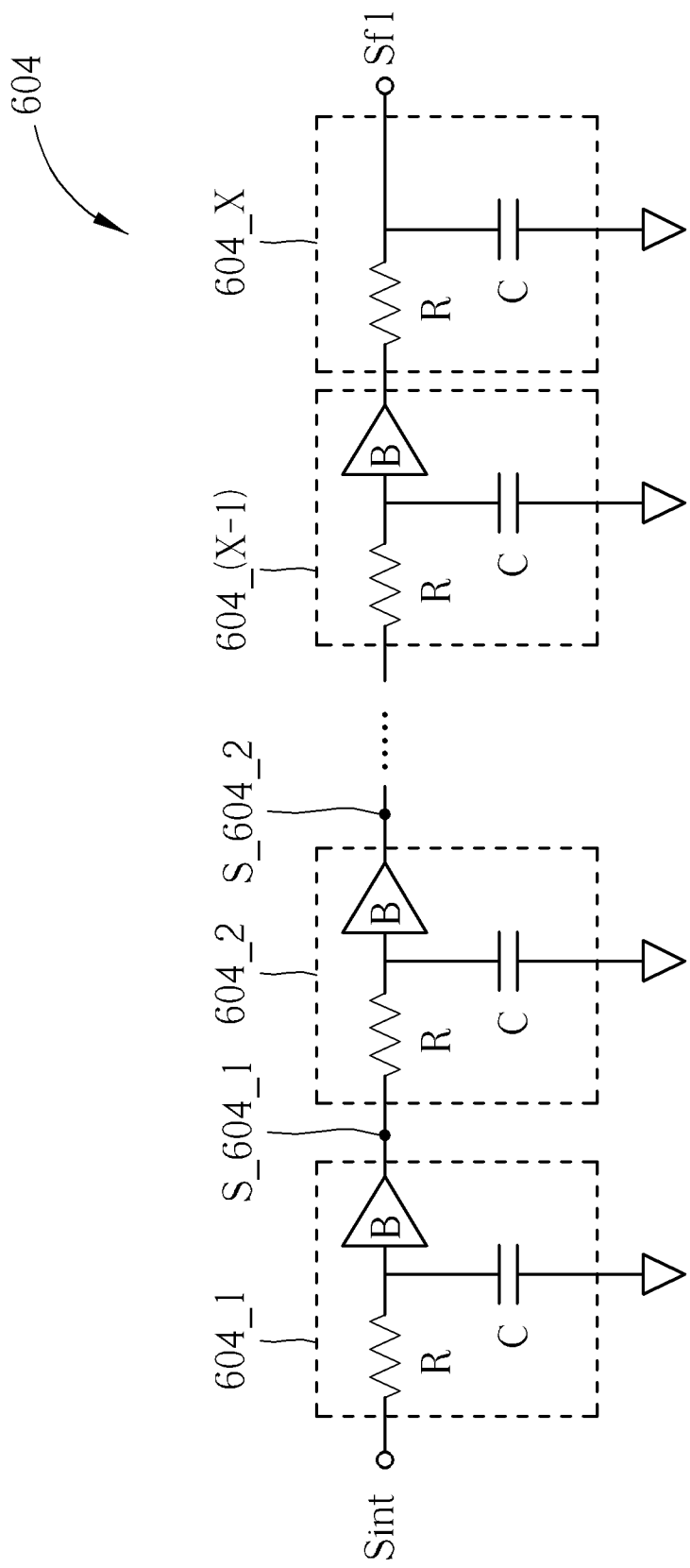
FIG. 6 is a fourth embodiment of the low-pass filter according to the present invention.

Please refer to FIG. 6, which is a fourth embodiment 604 of the low-pass filter 104 according to the present invention. The low-pass filter 604 comprises a plurality of RC (Resistor-capacitor) filters 604_1-604_x, in which x is any positive integer number. The plurality of RC filters 604_1-604_x are connected in series in which the first RC filter 604_1 of the plurality of RC filters 604_1-604_x is arranged to receive the integrating signal Sint and the last RC filter 604_x of the plurality of RC filters 604_1-604_x is arranged to output the first filtered signal Sf1. Each RC filter of the plurality of RC filters 604_1-604_(x−1) comprises a resistor R, a capacitor C, and a buffer B. In the plurality of RC filters 604_1-604_(x−1), the resistor R has a first terminal for receiving a pre-filtering signal, the capacitor C has a first terminal coupled to the second terminal of the resistor R and a second terminal coupled to the ground voltage Vgnd, and the buffer B is arranged for outputting a post-filtering signal. More specifically, the buffer B has an input terminal coupled to the second terminal of the resistor R and an output terminal for outputting the post-filtering signal. For example, the pre-filtering signal of the first RC filter 604_1 is the integrating signal Sint, and the post-filtering signal of the first RC filter 604_1 is the signal S_604_1. The pre-filtering signal of the second RC filter 604_2 is the signal S_604_1, and the post-filtering signal of the first RC filter 604_2 is the signal S_604_2, and so on as shown in FIG. 6. It is noted that the last RC filter 604__x_ merely comprises one resistor R and one capacitor C, and the last RC filter 604__x_ is arranged for outputting the first filtered signal Sf1.

Figure 7:
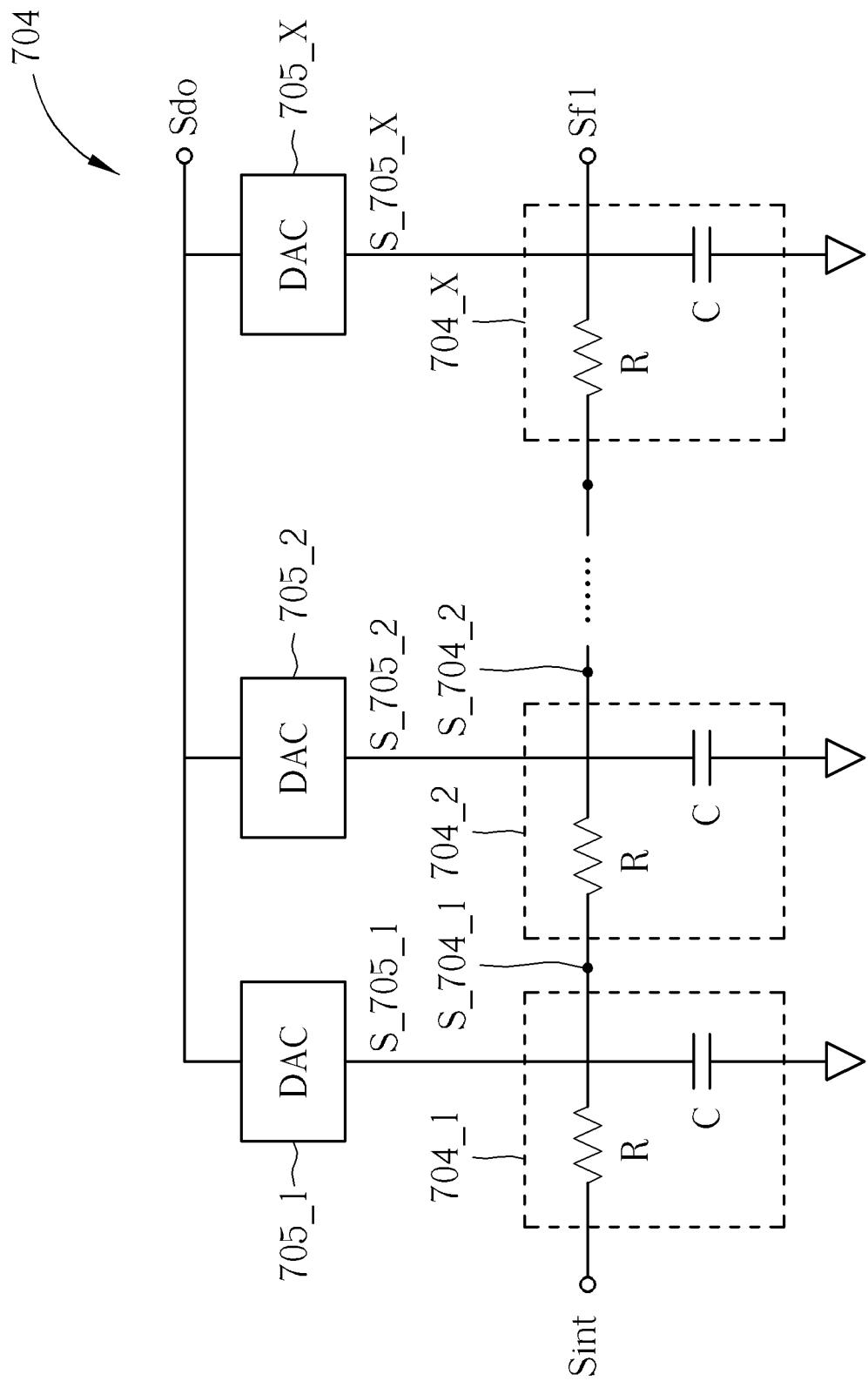
FIG. 7 is a fifth embodiment of the low-pass filter according to the present invention.

Please refer to FIG. 7, which is a fifth embodiment 704 of the low-pass filter 104 according to the present invention. The low-pass filter 704 comprises a plurality of RC (Resistor-capacitor) filters 704_1-704__x_ and a plurality of second DACs 705_1-705__x_, in which x is any positive integer number. The plurality of RC filters 704_1-704__x_ are connected in series in which the first RC filter 704_1 of the plurality of RC filters 704_1-704__x_ is arranged to receive the integrating signal Sint and the last RC filter 704__x_ of the plurality of RC filters 704_1-704__x_ is arranged to output the first filtered signal Sf1. Each RC filter of the plurality of RC filters 704_1-704__x_ comprises an resistor R and a capacitor C, and the resistor R has a first terminal for receiving a pre-filtering signal and a second terminal for outputting a post-filtering signal and the capacitor C has a first terminal coupled to the second terminal of the resistor R and a second terminal coupled to the ground voltage Vgnd. For example, the pre-filtering signal of the first RC filter 704_1 is the integrating signal Sint, and the post-filtering signal of the first RC filter 704_1 is the signal S_704_1. The pre-filtering signal of the second RC filter 704_2 is the signal S_704_1, and the post-filtering signal of the first RC filter 704_2 is the signal S_704_2, and so on. Moreover, the plurality of second DACs 705_1-705__x_ are arranged for generating a plurality of feedback signals S_705_1-S_705__x_ according to the digital output signal Sdo respectively, and the plurality of feedback signals S_705_1-S_705__x_ are feedback to the plurality of second terminals of the plurality of resistors R respectively as shown in FIG. 7.

Figure 8:
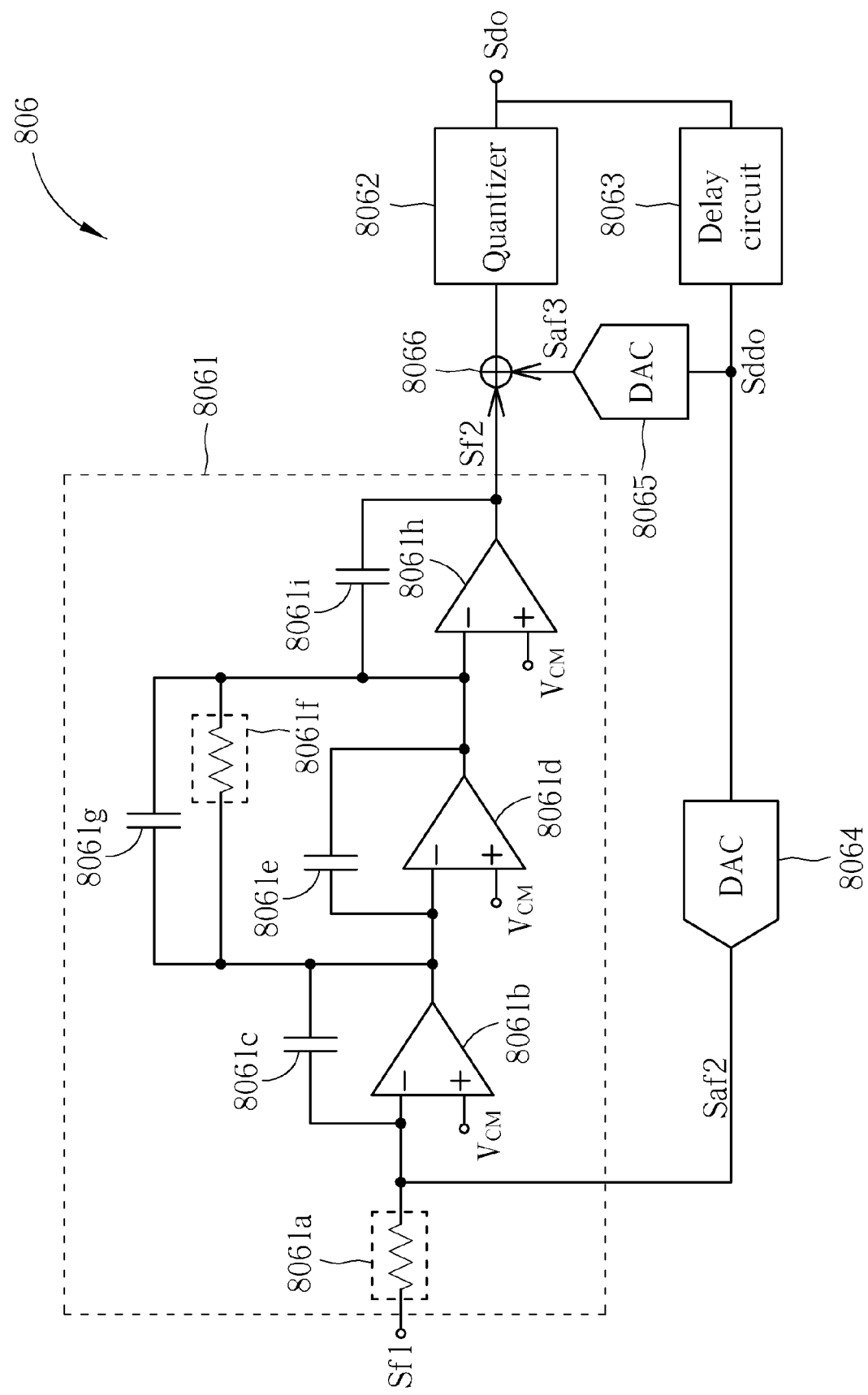
FIG. 8 is a first embodiment of an ADC according to the present invention.

Please refer to FIG. 8, which is a first embodiment 806 of the ADC 106 according to the present invention. The ADC 806 is a continuous-time delta-sigma modulating ADC, and the ADC 806 comprises a loop filter 8061, a quantizer 8062, a delay circuit 8063, a first digital-to-analog converter (DAC) 8064, and a second DAC 8065. The loop filter 8061 is arranged to generate a second filtered signal Sf2 according to the first filtered signal Sf1 and a second analog feedback signal Saf2. The quantizer 8062 is arranged to generate the digital output signal Sdo according to the second filtered signal and a third analog feedback signal Saf3. The delay circuit 8063 is arranged to generate a delayed digital signal Sddo by delaying the digital output signal Sdo. The first DAC 8064 is arranged to generate the second analog feedback signal Saf2 according to the delayed digital signal Sddo. The second DAC 8065 is arranged to generate the third analog feedback signal Saf3 according to the delayed digital signal Sddo.

The loop filter 8061 comprises a first resistor 8061_a_, a first operational amplifier 8061_b_, a first capacitor 8061_c_, a second operational amplifier 8061_d_, a second capacitor 8061_e_, a second resistor 8061_f_, a third capacitor 8061_g_, a third operational amplifier 8061_h_, and a fourth capacitor 8061_i_. The first resistor 8061_a_ has a first terminal for receiving the first filtered signal Sf1. The first operational amplifier 8061_b_ having a negative input terminal (−) coupled to a second terminal of the first resistor 8061_a_. The first capacitor 8061_c_ has a first terminal coupled to the negative input terminal (−) of the first operational amplifier 8061_b_ and a second terminal coupled to an output terminal of the first operational amplifier 8061_b_. The positive input terminal (+) of the first operational amplifier 8061_b_ is coupled to the common mode voltage Vcm of the first operational amplifier 8061_b_. The second operational amplifier 8061_d_ has a negative input terminal (−) coupled to the output terminal of the first operational amplifier 8061_b_. The second capacitor 8061_e_ has a first terminal coupled to the negative input terminal (−) of the second operational amplifier 8061_d_ and a second terminal coupled to an output terminal of the second operational amplifier 8061_d_. The positive input terminal (+) of the second operational amplifier 8061_d_ is coupled to the common mode voltage Vcm of the second operational amplifier 8061_d_. The second resistor 8061_f_ has a first terminal coupled to the negative input terminal (−) of the second operational amplifier 8061_d_ and a second terminal coupled to the output terminal of the second operational amplifier 8061_d_. The third capacitor 8061_g_ has a first terminal coupled to the negative input terminal (−) of the second operational amplifier 8061_d_ and a second terminal coupled to the output terminal of the second operational amplifier 8061_d_. The third operational amplifier 8061_h_ has a negative input terminal (−) coupled to the output terminal of the second operational amplifier 8061_d_. The fourth capacitor 8061_i_ has a first terminal coupled to the negative input terminal (−) of the third operational amplifier 8061_h_ and a second terminal coupled to an output terminal of the third operational amplifier 8061_h_. The positive input terminal (+) of the third operational amplifier 8061_h_ is coupled to the common mode voltage Vcm of the third operational amplifier 8061_h_.

According to the embodiment, the second analog feedback signal Saf2 is feedback to the negative input terminal (−) of the first operational amplifier 8061_b_, and the output terminal of the third operational amplifier 8061_h_ is arranged to output the second filtered signal Sf2. Moreover, the loop filter 8061 further comprises a combining circuit 8066 arranged to combine the second filtered signal Sf2 and the third analog feedback signal Saf3, and to generate a combining signal for the quantizer 8062. The quantizer 8062 is arranged to generate the digital output signal Sdo according to the combining signal.

Figure 9:
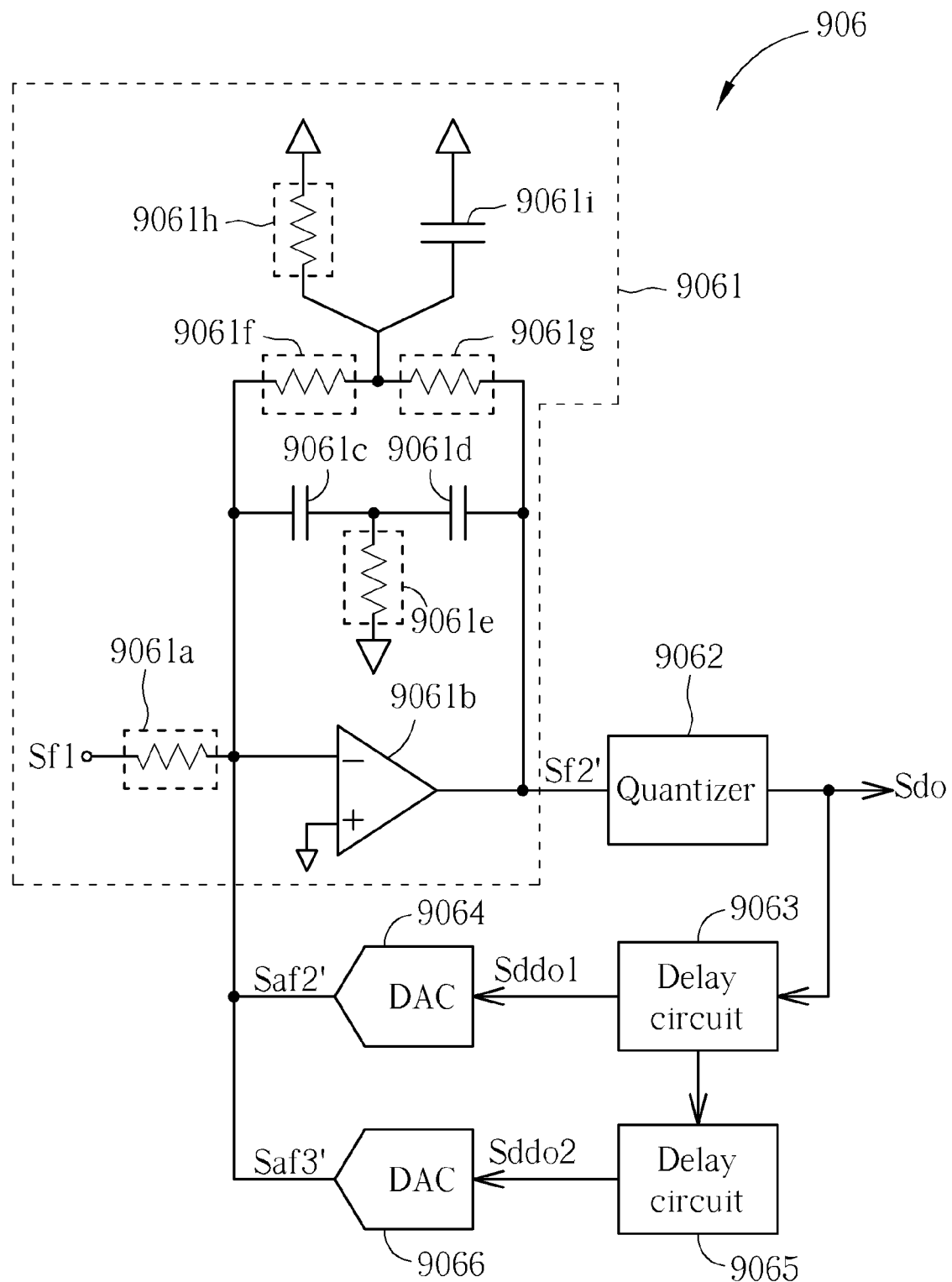
FIG. 9 is a second embodiment of the ADC according to the present invention.

Please refer to FIG. 9, which is a second embodiment 906 of the ADC 106 according to the present invention. The ADC 906 is a continuous-time delta-sigma modulating ADC, and the ADC 906 comprises a loop filter 9061, a quantizer 9062, a first delay circuit 9063, a first digital-to-analog converter (DAC) 9064, a second delay circuit 9065, and a second DAC 9066. The loop filter 9061 is arranged to generate a second filtered signal Sf2' according to the first filtered signal Sf1, a second analog feedback signal Saf2', and a third analog feedback signal Saf3'. The quantizer 9062 is arranged to generate the digital output signal Sdo according to the second filtered signal Sf2'. The first delay circuit 9063 is arranged to generate a first delayed digital signal Sddo1 by delaying the digital output signal Sdo. The first DAC 9064 is arranged to generate the second analog feedback signal Saf2' according to the first delayed digital signal Sddo1. The second delay circuit 9065 is arranged to generate a second delayed digital signal Sddo2 by delaying the first delayed digital signal Sddo1. The second DAC 9066 is arranged to generate the third analog feedback signal Saf3' according to the second delayed digital signal Sddo2.

The loop filter 9061 is a single-operational-amplifier resonator, and the loop filter 9061 comprises a first resistor 9061a, an operational amplifier 9061b, a first capacitor 9061c, a second capacitor 9061d, a second resistor 9061e, a third resistor 9061f, a fourth resistor 9061g, a fifth resistor 9061h, and a third capacitor 9061i. The first resistor 9061a has a first terminal for receiving the first filtered signal Sf1. The operational amplifier 9061b has a negative input terminal (−) coupled to a second terminal of the first resistor 9061a. The operational amplifier 9061b has a positive input terminal (+) coupled to a reference voltage, e.g. a common mode voltage or a ground voltage. The first capacitor 9061c has a first terminal coupled to the negative input terminal (−) of the operational amplifier 9061b. The second capacitor 9061d has a first terminal coupled to a second terminal of the first capacitor 9061c and a second terminal coupled to an output terminal of the operational amplifier 9061b. The second resistor 9061e has a first terminal coupled to the second terminal of the first capacitor 9061c and a second terminal coupled to a reference voltage, e.g. the ground voltage. The third resistor 9061f has a first terminal coupled to the negative input terminal (−) of the operational amplifier 9061b. The fourth resistor 9061g has a first terminal coupled to a second terminal of the third resistor 9061f and a second terminal coupled to the output terminal of the operational amplifier 9061b. The fifth resistor 9061h has a first terminal coupled to the second terminal of the third resistor 9061f and a second terminal coupled to the ground voltage. The third capacitor 9061i has a first terminal coupled to the second terminal of the third resistor 9061f and a second terminal coupled to the ground voltage.

According to the embodiment, the second analog feedback signal Saf2' and the third analog feedback signal Saf3' are feedback to the negative input terminal (−) of the operational amplifier 9061b, and the output terminal of the operational amplifier 9061b is arranged to output the second filtered signal Sf2'.

Figure 10:
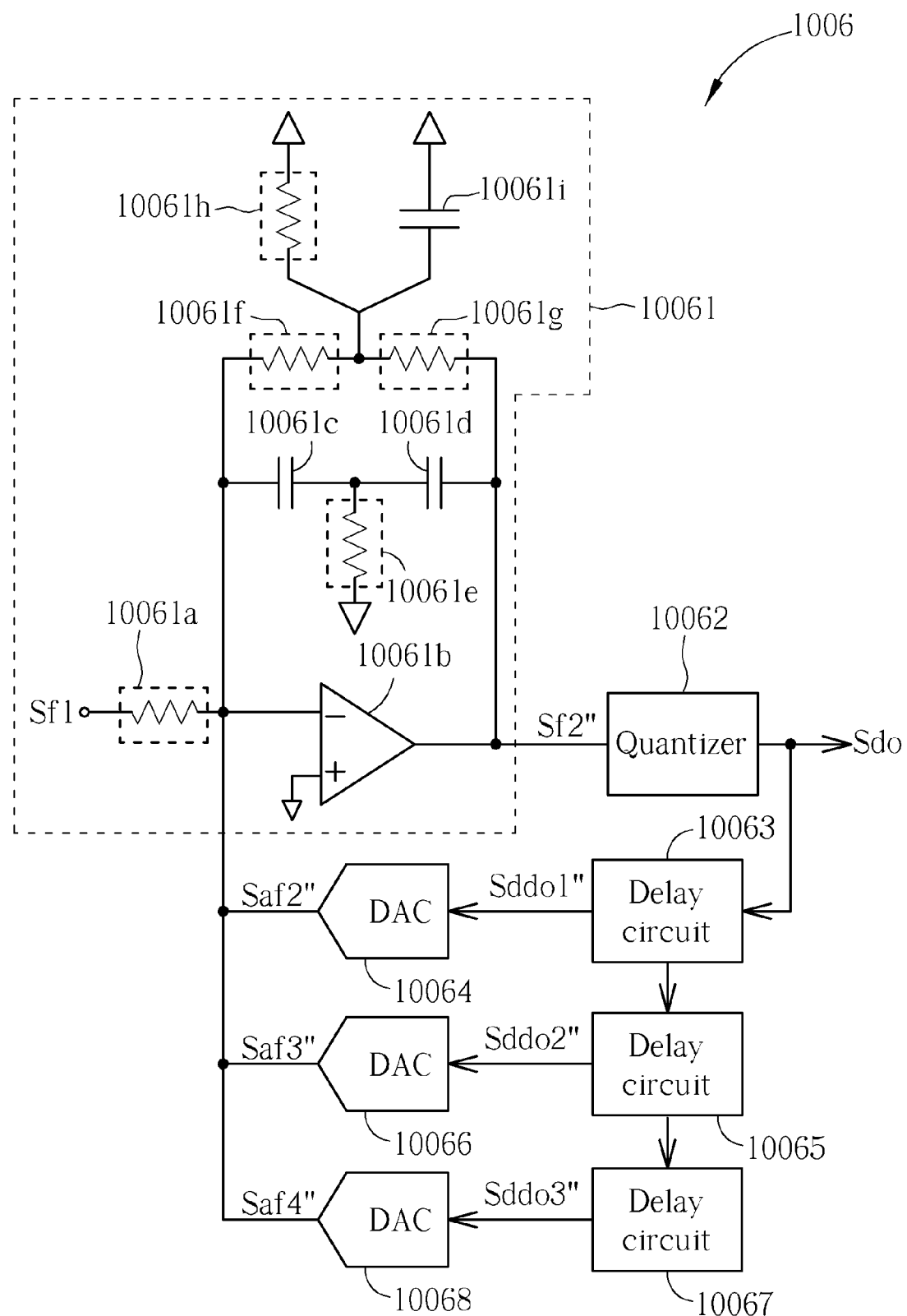
FIG. 10 is a third embodiment of the ADC according to the present invention.

Please refer to FIG. 10, which is a third embodiment 1006 of the ADC 106 according to the present invention. The ADC 1006 is a continuous-time delta-sigma modulating ADC, and the ADC 1006 comprises a loop filter 10061, a quantizer 10062, a first delay circuit 10063, a first digital-to-analog converter (DAC) 10064, a second delay circuit 10065, a second DAC 10066, a third delay circuit 10067, and a third DAC 10068. The loop filter 10061 is arranged to generate a second filtered signal Sf2" according to the first filtered signal Sf1, a second analog feedback signal Saf2", a third analog feedback signal Saf3", and a fourth analog feedback signal Saf4". The quantizer 10062 is arranged to generate the digital output signal Sdo according to the second filtered signal Sf2". The first delay circuit 10063 is arranged to generate a first delayed digital signal Sddo1" by delaying the digital output signal Sdo. The first DAC 10064 is arranged to generate the second analog feedback signal Saf2" according to the first delayed digital signal Sddo1". The second delay circuit 10065 is arranged to generate a second delayed digital signal Sddo2" by delaying the first delayed digital signal Sddo1". The second DAC 10066 is arranged to generate the third analog feedback signal Saf3" according to the second delayed digital signal Sddo2". The third delay circuit 10067 is arranged to generate a third delayed digital signal Sddo3" by delaying the second delayed digital signal Sddo2". The third DAC 10068 is arranged to generate the fourth analog feedback signal Saf4" according to the third delayed digital signal Sddo3".

The loop filter 10061 is a single-operational-amplifier resonator, and the loop filter 10061 is similar to the loop filter 9061. Thus, the detailed description of the loop filter 10061 is omitted here for brevity.

According to the embodiment, the second analog feedback signal Saf2", the third analog feedback signal Saf3", and the fourth analog feedback signal Saf4" are feedback to the negative input terminal (−) of the operational amplifier 10061b, and the output terminal of the operational amplifier 10061b is arranged to output the second filtered signal Sf2".

Figure 11:
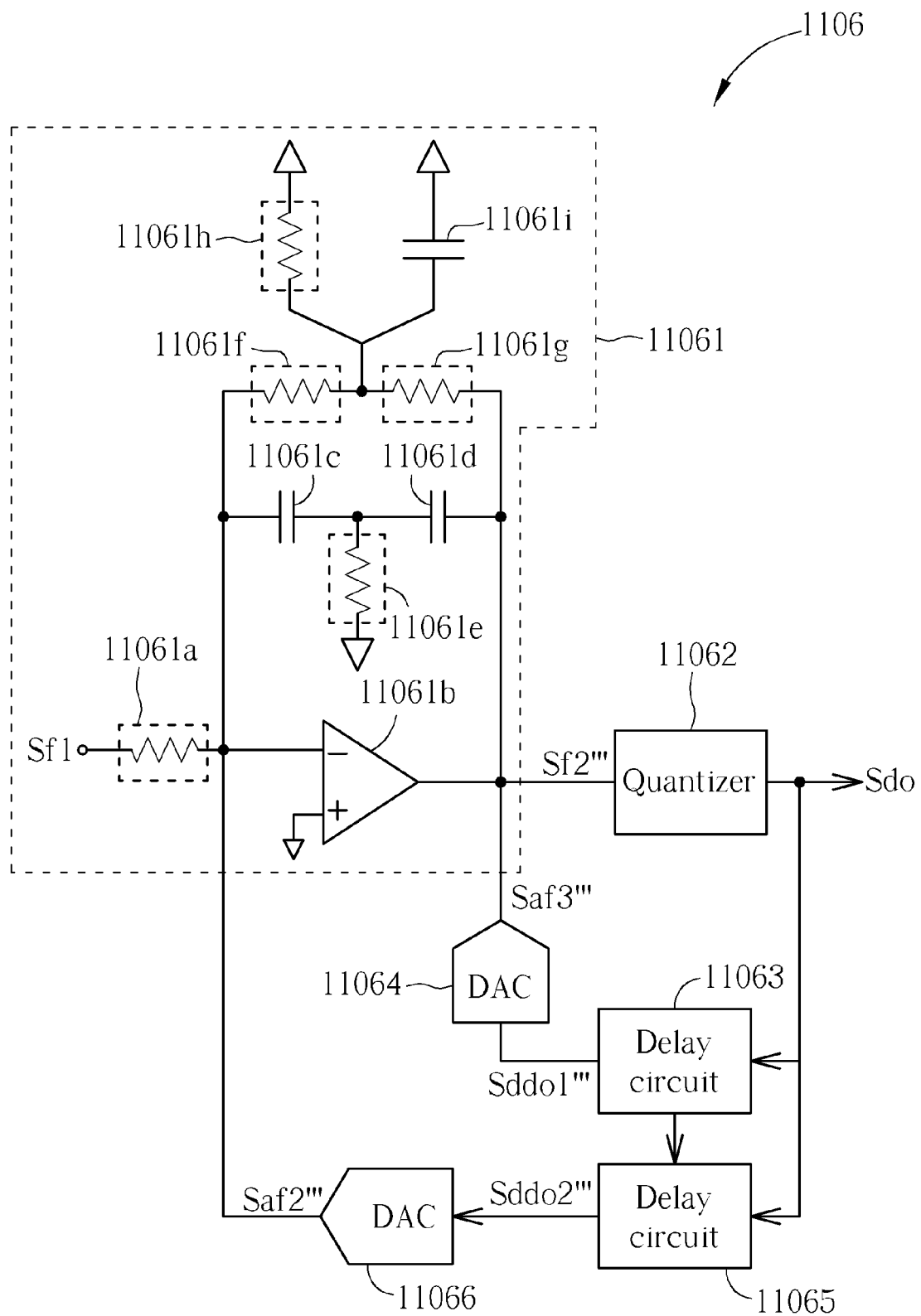
FIG. 11 is a fourth embodiment of the ADC according to the present invention.

Please refer to FIG. 11, which is a fourth embodiment 1106 of the ADC 106 according to the present invention. The ADC 1106 is a continuous-time delta-sigma modulating ADC, and the ADC 1106 comprises a loop filter 11061, a quantizer 11062, a first delay circuit 11063, a first digital-to-analog converter (DAC) 11064, a second delay circuit 11065, and a second DAC 11066. The loop filter 11061 is arranged to generate a second filtered signal Sf2''' according to the first filtered signal Sf1, a second analog feedback signal Saf2''', and a third analog feedback signal 3'''. The quantizer 11062 is arranged to generate the digital output signal Sdo according to the second filtered signal Sf2''' and the third analog feedback signal Saf3'''. The first delay circuit 11063 is arranged to generate a first delayed digital signal Sddo1''' by delaying the digital output signal Sdo. The first DAC 11064 is arranged to generate the third analog feedback signal Saf3''' according to the first delayed digital signal Sddo1'''. The second delay circuit 11065 is arranged to generate a second delayed digital signal Sddo2''' by delaying the first delayed digital signal Sddo1'''. The second DAC 11066 is arranged to generate the second analog feedback signal Saf2''' according to the second delayed digital signal Sddo2'''.

The loop filter 11061 is a single-operational-amplifier resonator, and the loop filter 11061 is similar to the loop filter 9061. Thus, the detailed description of the loop filter 11061 is omitted here for brevity.

According to the embodiment, the second analog feedback signal Saf2''' is feedback to the negative input terminal (−) of the operational amplifier 11061b, and the output terminal of the operational amplifier 11061b is arranged to output the second filtered signal Sf2'''. The third analog feedback signal Saf3''' is feedback to the output terminal of the operational amplifier 11061b, and the quantizer 11062 is arranged to output the digital output signal Sdo according to the second filtered signal Sf2''' and the third analog feedback signal Saf3'''.

The above FIG. 3-FIG. 11 illustrate the different embodiments of the low-pass filter 104 and the ADC 106 respectively. Any combinations of the different embodiments can be applied into the low-pass filter 104 and the ADC 106 of the analog-to-digital converting device 100 or the analog-to-digital converting device 200. The order of the ADC 106 is also not limited to be the same as that shown in the above embodiments. As a person skilled in the art can readily understand details of the modified analog-to-digital converting devices after reading above paragraphs, further description is omitted here for brevity.

It should be noted that, for illustration purposes, the embodiments as shown in above FIG. 1-FIG. 11 have been simplified into the single-ended versions. Those skilled in the art are appreciated to understand that, in practical, the present analog-to-digital converting device may be implemented as fully-differential devices, and the fully-differential devices also have the similar characteristics and advantages. As those skilled in the art are appreciated to understand the operation of the fully-differential version of the analog-to-digital converting device, the detailed description is omitted here for brevity.

In summary, the method of the above mentioned analog-to-digital converting device 100 or the analog-to-digital converting device 200 can be summarized into the steps of FIG.

Figure 12:
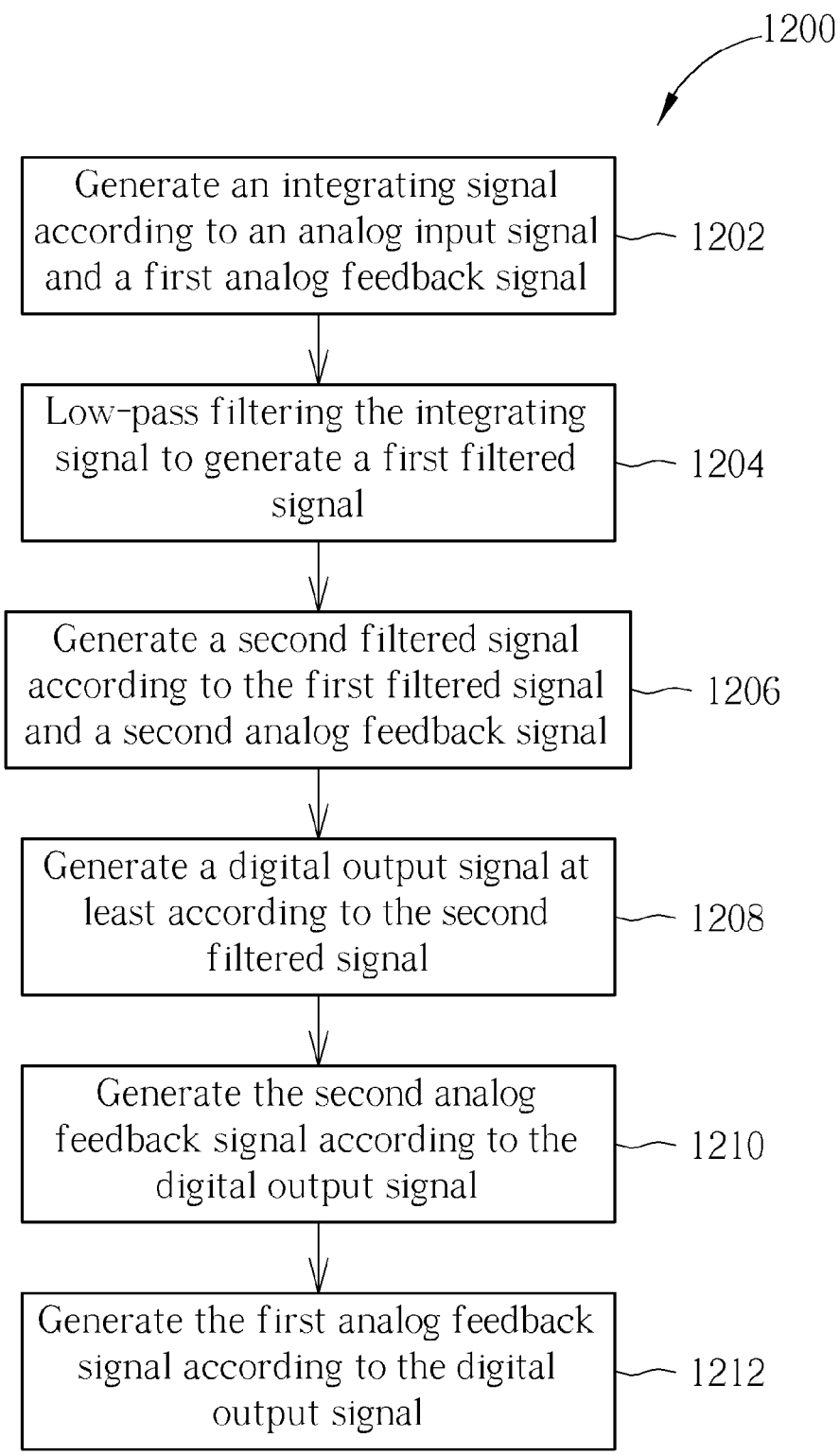
FIG. 12 is a flowchart illustrating an analog-to-digital converting method according to an embodiment of the present invention.

12. FIG. 12 is a flowchart illustrating an analog-to-digital converting method 1200 according to an embodiment of the present invention. Provided that substantially the same result is achieved, the steps of the flowchart shown in FIG. 12 need not be in the exact order shown and need not be contiguous, that is, other steps can be intermediate. The analog-to-digital converting method 1200 comprises:

Step 1202: Generate the integrating signal Sint according to the analog input signal Sin and the first analog feedback signal Saf1;

Step 1204: Low-pass filtering the integrating signal Sint to generate the first filtered signal Sf1;

Step 1206: Generate the second filtered signal Sf2 according to the first filtered signal Sf1 and the second analog feedback signal Saf2;

Step 1208: Generate the digital output signal Sdo at least according to the second filtered signal Sf2;

Step 1210: Generate the second analog feedback signal Saf2 according to the digital output signal Sdo; and Step 1212: Generate the first analog feedback signal Saf1 according to the digital output signal Sdo.

Briefly, according to the above embodiments, the low-pass filter 104, the ADC 106, the delay circuit 109, the first DAC 108, and the integrator 102 are configured to be a closed-loop circuit. As the integrator 102 has high gain, the noise of ADC 106 can be greatly reduced when referred to the input of device 100. In other words, the specification requirement of the ADC 106 can be relaxed. As a result, the areas and powers of the present analog-to-digital converting device 100 and the analog-to-digital converting device 200 are reduced.

Moreover, when the ADC 106 is incorporated into the closed-loop circuit, the stability of ADC 106 is almost not affected. This is because the bandwidth of the low-pass filter 104 is much smaller than the bandwidth of the ADC 106. And when the ADC 106 receives the first filtered signal Sf1 generated by the circuit comprised of the first DAC 108, the integrator 102, and the low-pass filter 104, the bandwidth of the first filtered signal Sf1 is also very small in comparison to the bandwidth of the ADC 106. Thus, the ADC 106 can be kept stable.

In addition, when the noise level requirement of the ADC 106 is reduced, the specification requirement of the low-pass filter 104 (or 504) is relaxed. Then, the low-pass filter 104 can be designed to have large resistance and small capacitance to reduce the size area of the low-pass filter 104. Therefore, the area of the present analog-to-digital converting device 100 (or 200) is further reduced.

Accordingly, by incorporating the ADC 106 into a filter loop (i.e. the circuit comprised of the delay circuit 109, the first DAC 108, the integrator 102, and the low-pass filter 104), the noise of the ADC 106 can be greatly reduced.

It should be noted that the analog-to-digital converting device 100 (or 200) can also be regarded as a filter even though the ADC 106 is incorporated therein. According to one embodiment, the signal transfer function (STF) of the analog-to-digital converting device 100 (or 200) is a $2^{nd}$ order signal transfer function while taking an example that the low-pass filter 104 is a $1^{st}$ order RC filter. Thus, the analog-to-digital converting device 100 (or 200) can be regarded as a $2^{nd}$ order filter. Meanwhile, the noise transfer function (NTF) of the ADC 106 is increased by one order when the ADC 106 is incorporated into the filter loop. Thus, the ADC 106 has steeper noise-shaping effect in comparison to the conventional counterpart.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An analog-to-digital converting device, comprising:
   an integrator, arranged to generate an integrating signal according to an analog input signal and a first analog feedback signal, wherein the analog input signal is a down-converted voltage signal, and the integrator comprises:
      a resistor, having a first terminal for receiving the analog input signal;
      an operational amplifier, having an input terminal coupled to a second terminal of the resistor, and an output terminal for outputting the integrating signal; and
      a capacitor, having a first terminal coupled to the input terminal of the operational amplifier and a second terminal coupled to the output terminal of the operational amplifier, wherein the first analog feedback signal is feedback to the input terminal of the operational amplifier;
   a low-pass filter, arranged to generate a first filtered signal according to the integrating signal;
   an analog-to-digital converter, arranged to generate a digital output signal according to the first filtered signal; and
   a first digital-to-analog converter, arranged to generate the first analog feedback signal according to the digital output signal.

2. The analog-to-digital converting device of claim 1, further comprising:
   a delay circuit, arranged to generate a delayed digital signal by delaying the digital output signal;
   wherein the first digital-to-analog converter generates the first analog feedback signal according to the delayed digital signal.

3. The analog-to-digital converting device of claim 1, wherein the resistor is an adjustable resistor.

4. An analog-to-digital converting device, comprising:
   an integrator, arranged to generate an integrating signal according to an analog input signal and a first analog feedback signal, wherein the analog input signal is a down-converted current signal, and the integrator comprises:
      an operational amplifier, having an input terminal for receiving the analog input signal, and an output terminal for outputting the integrating signal; and
      a capacitor, having a first terminal coupled to the input terminal of the operational amplifier and a second terminal coupled to the output terminal of the operational amplifier, wherein the first analog feedback signal is feedback to the input terminal of the operational amplifier;
   a low-pass filter, arranged to generate a first filtered signal according to the integrating signal;
   an analog-to-digital converter, arranged to generate a digital output signal according to the first filtered signal; and
   a first digital-to-analog converter, arranged to generate the first analog feedback signal according to the digital output signal.

5. The analog-to-digital converting device of claim 1, wherein the low-pass filter comprises:
   a plurality of LR (Inductor-resistor) filters, the plurality of LR filters are connected in series in which the first LR filter of the plurality of LR filters is arranged to receive the integrating signal and the last LR filter of the plurality of LR filters is arranged to output the first filtered signal.

6. The analog-to-digital converting device of claim 1, wherein the low-pass filter comprises:
a plurality of LC (Inductor-capacitor) filters, the plurality of LC filters are connected in series in which the first LC filter of the plurality of LC filters is arranged to receive the integrating signal and the last LC filter of the plurality of LC filters is arranged to output the first filtered signal.

7. The analog-to-digital converting device of claim 1, wherein the low-pass filter comprises:
a plurality of RC (Resistor-capacitor) filters, the plurality of RC filters are connected in series in which the first RC filter of the plurality of RC filters is arranged to receive the integrating signal and the last RC filter of the plurality of RC filters is arranged to output the first filtered signal.

8. The analog-to-digital converting device of claim 7, wherein at least one RC filter of the plurality of RC filters further comprises:
a buffer, for outputting a post-filtering signal to a next RC filter of the plurality of RC filters.

9. The analog-to-digital converting device of claim 7, further comprising:
a plurality of second digital-to-analog converters, for generating a plurality of feedback signals according to the digital output signal respectively;
wherein the plurality of feedback signals are feedback into the plurality of the RC filters respectively.

10. The analog-to-digital converting device of claim 1, wherein the analog-to-digital converter (ADC) is a flash ADC, a successive approximate ADC, or a continuous-time delta-sigma ADC.

11. The analog-to-digital converting device of claim 1, wherein the analog-to-digital converter comprises:
a loop filter, arranged to generate a second filtered signal according to the first filtered signal and a second analog feedback signal;
a quantizer, arranged to generate the digital output signal at least according to the second filtered signal; and
a second digital-to-analog converter, arranged to generate the second analog feedback signal according to the digital output signal.

12. The analog-to-digital converting device of claim 11, wherein the analog-to-digital converter further comprises:
a first delay circuit, arranged to generate a first delayed digital signal by delaying the digital output signal;
wherein the second digital-to-analog converter generates the second analog feedback signal according to the first delayed digital signal.

13. The analog-to-digital converting device of claim 12, wherein the analog-to-digital converter further comprises:
a second delay circuit, arranged to generate a second delayed digital signal by delaying the first delayed digital signal; and
a third digital-to-analog converter, arranged to generate a third analog feedback signal according to the second delayed digital signal;
wherein the third analog feedback signal is feedback to the loop filter, and the loop filter generates the second filtered signal according to the first filtered signal, the second analog feedback signal, and the third analog feedback signal.

14. The analog-to-digital converting device of claim 12, wherein the analog-to-digital converter further comprises:
a third digital-to-analog converter, arranged to generate a third analog feedback signal according to the first delayed digital signal;
wherein the third analog feedback signal is feedback to the quantizer, and the quantizer is arranged to generate the digital output signal according to the second filtered signal and the third analog feedback signal.

15. The analog-to-digital converting device of claim 12, wherein the analog-to-digital converter further comprises:
a second delay circuit, arranged to generate a second delayed digital signal by delaying the digital output signal;
a third digital-to-analog converter, arranged to generate a third analog feedback signal according to the second delayed digital signal;
wherein the third analog feedback signal is feedback to the quantizer, and the quantizer is arranged to generate the digital output signal according to the second filtered signal and the third analog feedback signal.

16. An analog-to-digital converting method, comprising:
generating an integrating signal according to an analog input signal and an first analog feedback signal;
low-pass filtering the integrating signal to generate a first filtered signal;
generating a digital output signal according to the first filtered signal, wherein the step of generating the digital output signal according to the first filtered signal comprises:
generating a second filtered signal according to the first filtered signal and a second analog feedback signal;
generating the digital output signal at least according to the second filtered signal; and
generating the second analog feedback signal according to the digital output signal; and
generating the first analog feedback signal according to the digital output signal.

17. The analog-to-digital converting method of claim 16, further comprising:
generating a delayed digital signal by delaying the digital output signal;
wherein the step of generating the first analog feedback signal according to the digital output signal comprises:
generating the first analog feedback signal according to the delayed digital signal.

18. The analog-to-digital converting method of claim 16, wherein the analog input signal is an analog current signal or an analog voltage signal.

19. The analog-to-digital converting method of claim 16, wherein the step of generating the digital output signal according to the first filtered signal further comprises:
generating a first delayed digital signal by delaying the digital output signal;
wherein the step of generating the second analog feedback signal according to the digital output signal comprises:
generating the second analog feedback signal according to the first delayed digital signal.

20. The analog-to-digital converting method of claim 19, wherein the step of generating the digital output signal according to the first filtered signal further comprises:
generating a second delayed digital signal by delaying the first delayed digital signal; and
generating a third analog feedback signal according to the second delayed digital signal;
wherein the step of generating the second filtered signal according to the first filtered signal and the second analog feedback signal comprises:
generating the second filtered signal according to the first filtered signal, the second analog feedback signal, and the third analog feedback signal.

21. The analog-to-digital converting method of claim 20, wherein the step of generating the digital output signal according to the first filtered signal further comprises:
generating a third delayed digital signal by delaying the second delayed digital signal; and
generating a fourth analog feedback signal according to the third delayed digital signal;
wherein the step of generating the second filtered signal according to the first filtered signal and the second analog feedback signal comprises:
generating the second filtered signal according to the first filtered signal, the second analog feedback signal, the third analog feedback signal, and the fourth analog feedback signal.

22. The analog-to-digital converting method of claim 19, wherein the step of generating the digital output signal according to the first filtered signal further comprises:
generating a third analog feedback signal according to the first delayed digital signal;
wherein the step of generating the digital output signal at least according to the second filtered signal comprises:
generating the digital output signal according to the second filtered signal and the third analog feedback signal.

23. The analog-to-digital converting method of claim 19, wherein the step of generating the digital output signal according to the first filtered signal further comprises:
generating a second delayed digital signal by delaying the digital output signal;
generating a third analog feedback signal according to the second delayed digital signal;
wherein the step of generating the digital output signal at least according to the second filtered signal comprises:
generating the digital output signal according to the second filtered signal and the third analog feedback signal.

24. The analog-to-digital converting device of claim 4, further comprising:
a delay circuit, arranged to generate a delayed digital signal by delaying the digital output signal;
wherein the first digital-to-analog converter generates the first analog feedback signal according to the delayed digital signal.

25. The analog-to-digital converting device of claim 4, wherein the low-pass filter comprises:
a plurality of LR (Inductor-resistor) filters, the plurality of LR filters are connected in series in which the first LR filter of the plurality of LR filters is arranged to receive the integrating signal and the last LR filter of the plurality of LR filters is arranged to output the first filtered signal.

26. The analog-to-digital converting device of claim 4, wherein the low-pass filter comprises:
a plurality of LC (Inductor-capacitor) filters, the plurality of LC filters are connected in series in which the first LC filter of the plurality of LC filters is arranged to receive the integrating signal and the last LC filter of the plurality of LC filters is arranged to output the first filtered signal.

27. The analog-to-digital converting device of claim 4, wherein the low-pass filter comprises:
a plurality of RC (Resistor-capacitor) filters, the plurality of RC filters are connected in series in which the first RC filter of the plurality of RC filters is arranged to receive the integrating signal and the last RC filter of the plurality of RC filters is arranged to output the first filtered signal.

28. The analog-to-digital converting device of claim 27, wherein at least one RC filter of the plurality of RC filters further comprises:
a buffer, for outputting a post-filtering signal to a next RC filter of the plurality of RC filters.

29. The analog-to-digital converting device of claim 27, further comprising:
a plurality of second digital-to-analog converters, for generating a plurality of feedback signals according to the digital output signal respectively;
wherein the plurality of feedback signals are feedback into the plurality of the RC filters respectively.

30. The analog-to-digital converting device of claim 4, wherein the analog-to-digital converter (ADC) is a flash ADC, a successive approximate ADC, or a continuous-time delta-sigma ADC.

31. The analog-to-digital converting device of claim 4, wherein the analog-to-digital converter comprises:
a loop filter, arranged to generate a second filtered signal according to the first filtered signal and a second analog feedback signal;
a quantizer, arranged to generate the digital output signal at least according to the second filtered signal; and
a second digital-to-analog converter, arranged to generate the second analog feedback signal according to the digital output signal.

32. The analog-to-digital converting device of claim 31, wherein the analog-to-digital converter further comprises:
a first delay circuit, arranged to generate a first delayed digital signal by delaying the digital output signal;
wherein the second digital-to-analog converter generates the second analog feedback signal according to the first delayed digital signal.

33. The analog-to-digital converting device of claim 32, wherein the analog-to-digital converter further comprises:
a second delay circuit, arranged to generate a second delayed digital signal by delaying the first delayed digital signal; and
a third digital-to-analog converter, arranged to generate a third analog feedback signal according to the second delayed digital signal;
wherein the third analog feedback signal is feedback to the loop filter, and the loop filter generates the second filtered signal according to the first filtered signal, the second analog feedback signal, and the third analog feedback signal.

34. The analog-to-digital converting device of claim 32, wherein the analog-to-digital converter further comprises:
a third digital-to-analog converter, arranged to generate a third analog feedback signal according to the first delayed digital signal;
wherein the third analog feedback signal is feedback to the quantizer, and the quantizer is arranged to generate the digital output signal according to the second filtered signal and the third analog feedback signal.

35. The analog-to-digital converting device of claim 32, wherein the analog-to-digital converter further comprises:
a second delay circuit, arranged to generate a second delayed digital signal by delaying the digital output signal;
a third digital-to-analog converter, arranged to generate a third analog feedback signal according to the second delayed digital signal;
wherein the third analog feedback signal is feedback to the quantizer, and the quantizer is arranged to generate the digital output signal according to the second filtered signal and the third analog feedback signal.

36. An analog-to-digital converting device, comprising:
- an integrator, arranged to generate an integrating signal according to an analog input signal and a first analog feedback signal;
- a low-pass filter, arranged to generate a first filtered signal according to the integrating signal, wherein the low-pass filter comprises:
  - a plurality of LR (Inductor-resistor) filters, the plurality of LR filters are connected in series in which the first LR filter of the plurality of LR filters is arranged to receive the integrating signal and the last LR filter of the plurality of LR filters is arranged to output the first filtered signal;
- an analog-to-digital converter, arranged to generate a digital output signal according to the first filtered signal; and
- a first digital-to-analog converter, arranged to generate the first analog feedback signal according to the digital output signal.

37. The analog-to-digital converting device of claim 36, further comprising:
- a delay circuit, arranged to generate a delayed digital signal by delaying the digital output signal;
- wherein the first digital-to-analog converter generates the first analog feedback signal according to the delayed digital signal.

38. The analog-to-digital converting device of claim 36, wherein the integrator comprises:
- a resistor, having a first terminal for receiving the analog input signal;
- an operational amplifier, having an input terminal coupled to a second terminal of the resistor, and an output terminal for outputting the integrating signal; and
- a capacitor, having a first terminal coupled to the input terminal of the operational amplifier and a second terminal coupled to the output terminal of the operational amplifier;
- wherein the first analog feedback signal is feedback to the input terminal of the operational amplifier.

39. The analog-to-digital converting device of claim 38, wherein the resistor is an adjustable resistor.

40. The analog-to-digital converting device of claim 36, wherein the integrator comprises:
- an operational amplifier, having an input terminal for receiving the analog input signal, and an output terminal for outputting the integrating signal; and
- a capacitor, having a first terminal coupled to the input terminal of the operational amplifier and a second terminal coupled to the output terminal of the operational amplifier;
- wherein the first analog feedback signal is feedback to the input terminal of the operational amplifier.

41. The analog-to-digital converting device of claim 36, wherein the low-pass filter comprises:
- a plurality of LC (Inductor-capacitor) filters, the plurality of LC filters are connected in series in which the first LC filter of the plurality of LC filters is arranged to receive the integrating signal and the last LC filter of the plurality of LC filters is arranged to output the first filtered signal.

42. The analog-to-digital converting device of claim 36, wherein the low-pass filter comprises:
- a plurality of RC (Resistor-capacitor) filters, the plurality of RC filters are connected in series in which the first RC filter of the plurality of RC filters is arranged to receive the integrating signal and the last RC filter of the plurality of RC filters is arranged to output the first filtered signal.

43. The analog-to-digital converting device of claim 42, wherein at least one RC filter of the plurality of RC filters further comprises:
- a buffer, for outputting a post-filtering signal to a next RC filter of the plurality of RC filters.

44. The analog-to-digital converting device of claim 42, further comprising:
- a plurality of second digital-to-analog converters, for generating a plurality of feedback signals according to the digital output signal respectively;
- wherein the plurality of feedback signals are feedback into the plurality of the RC filters respectively.

45. The analog-to-digital converting device of claim 36, wherein the analog-to-digital converter (ADC) is a flash ADC, a successive approximate ADC, or a continuous-time delta-sigma ADC.

46. The analog-to-digital converting device of claim 36, wherein the analog-to-digital converter comprises:
- a loop filter, arranged to generate a second filtered signal according to the first filtered signal and a second analog feedback signal;
- a quantizer, arranged to generate the digital output signal at least according to the second filtered signal; and
- a second digital-to-analog converter, arranged to generate the second analog feedback signal according to the digital output signal.

47. The analog-to-digital converting device of claim 46, wherein the analog-to-digital converter further comprises:
- a first delay circuit, arranged to generate a first delayed digital signal by delaying the digital output signal;
- wherein the second digital-to-analog converter generates the second analog feedback signal according to the first delayed digital signal.

48. The analog-to-digital converting device of claim 47, wherein the analog-to-digital converter further comprises:
- a second delay circuit, arranged to generate a second delayed digital signal by delaying the first delayed digital signal; and
- a third digital-to-analog converter, arranged to generate a third analog feedback signal according to the second delayed digital signal;
- wherein the third analog feedback signal is feedback to the loop filter, and the loop filter generates the second filtered signal according to the first filtered signal, the second analog feedback signal, and the third analog feedback signal.

49. The analog-to-digital converting device of claim 47, wherein the analog-to-digital converter further comprises:
- a third digital-to-analog converter, arranged to generate a third analog feedback signal according to the first delayed digital signal;
- wherein the third analog feedback signal is feedback to the quantizer, and the quantizer is arranged to generate the digital output signal according to the second filtered signal and the third analog feedback signal.

50. The analog-to-digital converting device of claim 47, wherein the analog-to-digital converter further comprises:
- a second delay circuit, arranged to generate a second delayed digital signal by delaying the digital output signal;
- a third digital-to-analog converter, arranged to generate a third analog feedback signal according to the second delayed digital signal;
- wherein the third analog feedback signal is feedback to the quantizer, and the quantizer is arranged to generate the digital output signal according to the second filtered signal and the third analog feedback signal.

51. An analog-to-digital converting device, comprising:
 an integrator, arranged to generate an integrating signal according to an analog input signal and a first analog feedback signal;
 a low-pass filter, arranged to generate a first filtered signal according to the integrating signal, wherein the low-pass filter comprises:
  a plurality of LC (Inductor-capacitor) filters, the plurality of LC filters are connected in series in which the first LC filter of the plurality of LC filters is arranged to receive the integrating signal and the last LC filter of the plurality of LC filters is arranged to output the first filtered signal;
 an analog-to-digital converter, arranged to generate a digital output signal according to the first filtered signal; and
 a first digital-to-analog converter, arranged to generate the first analog feedback signal according to the digital output signal.

52. The analog-to-digital converting device of claim 51, further comprising:
 a delay circuit, arranged to generate a delayed digital signal by delaying the digital output signal;
 wherein the first digital-to-analog converter generates the first analog feedback signal according to the delayed digital signal.

53. The analog-to-digital converting device of claim 51, wherein the integrator comprises:
 a resistor, having a first terminal for receiving the analog input signal;
 an operational amplifier, having an input terminal coupled to a second terminal of the resistor, and an output terminal for outputting the integrating signal; and
 a capacitor, having a first terminal coupled to the input terminal of the operational amplifier and a second terminal coupled to the output terminal of the operational amplifier;
 wherein the first analog feedback signal is feedback to the input terminal of the operational amplifier.

54. The analog-to-digital converting device of claim 53, wherein the resistor is an adjustable resistor.

55. The analog-to-digital converting device of claim 51, wherein the integrator comprises:
 an operational amplifier, having an input terminal for receiving the analog input signal, and an output terminal for outputting the integrating signal; and
 a capacitor, having a first terminal coupled to the input terminal of the operational amplifier and a second terminal coupled to the output terminal of the operational amplifier;
 wherein the first analog feedback signal is feedback to the input terminal of the operational amplifier.

56. The analog-to-digital converting device of claim 51, wherein the low-pass filter comprises:
 a plurality of LR (Inductor-resistor) filters, the plurality of LR filters are connected in series in which the first LR filter of the plurality of LR filters is arranged to receive the integrating signal and the last LR filter of the plurality of LR filters is arranged to output the first filtered signal.

57. The analog-to-digital converting device of claim 51, wherein the low-pass filter comprises:
 a plurality of RC (Resistor-capacitor) filters, the plurality of RC filters are connected in series in which the first RC filter of the plurality of RC filters is arranged to receive the integrating signal and the last RC filter of the plurality of RC filters is arranged to output the first filtered signal.

58. The analog-to-digital converting device of claim 57, wherein at least one RC filter of the plurality of RC filters further comprises:
 a buffer, for outputting a post-filtering signal to a next RC filter of the plurality of RC filters.

59. The analog-to-digital converting device of claim 57, further comprising:
 a plurality of second digital-to-analog converters, for generating a plurality of feedback signals according to the digital output signal respectively;
 wherein the plurality of feedback signals are feedback into the plurality of the RC filters respectively.

60. The analog-to-digital converting device of claim 51, wherein the analog-to-digital converter (ADC) is a flash ADC, a successive approximate ADC, or a continuous-time delta-sigma ADC.

61. The analog-to-digital converting device of claim 51, wherein the analog-to-digital converter comprises:
 a loop filter, arranged to generate a second filtered signal according to the first filtered signal and a second analog feedback signal;
 a quantizer, arranged to generate the digital output signal at least according to the second filtered signal; and
 a second digital-to-analog converter, arranged to generate the second analog feedback signal according to the digital output signal.

62. The analog-to-digital converting device of claim 61, wherein the analog-to-digital converter further comprises:
 a first delay circuit, arranged to generate a first delayed digital signal by delaying the digital output signal;
 wherein the second digital-to-analog converter generates the second analog feedback signal according to the first delayed digital signal.

63. The analog-to-digital converting device of claim 62, wherein the analog-to-digital converter further comprises:
 a second delay circuit, arranged to generate a second delayed digital signal by delaying the first delayed digital signal; and
 a third digital-to-analog converter, arranged to generate a third analog feedback signal according to the second delayed digital signal;
 wherein the third analog feedback signal is feedback to the loop filter, and the loop filter generates the second filtered signal according to the first filtered signal, the second analog feedback signal, and the third analog feedback signal.

64. The analog-to-digital converting device of claim 62, wherein the analog-to-digital converter further comprises:
 a third digital-to-analog converter, arranged to generate a third analog feedback signal according to the first delayed digital signal;
 wherein the third analog feedback signal is feedback to the quantizer, and the quantizer is arranged to generate the digital output signal according to the second filtered signal and the third analog feedback signal.

65. The analog-to-digital converting device of claim 62, wherein the analog-to-digital converter further comprises:
 a second delay circuit, arranged to generate a second delayed digital signal by delaying the digital output signal;
 a third digital-to-analog converter, arranged to generate a third analog feedback signal according to the second delayed digital signal;
 wherein the third analog feedback signal is feedback to the quantizer, and the quantizer is arranged to generate the digital output signal according to the second filtered signal and the third analog feedback signal.

66. An analog-to-digital converting device, comprising:
  an integrator, arranged to generate an integrating signal according to an analog input signal and a first analog feedback signal;
  a low-pass filter, arranged to generate a first filtered signal according to the integrating signal, wherein the low-pass filter comprises:
    a plurality of RC (Resistor-capacitor) filters, the plurality of RC filters are connected in series in which the first RC filter of the plurality of RC filters is arranged to receive the integrating signal and the last RC filter of the plurality of RC filters is arranged to output the first filtered signal;
  an analog-to-digital converter, arranged to generate a digital output signal according to the first filtered signal; and
  a first digital-to-analog converter, arranged to generate the first analog feedback signal according to the digital output signal.

67. The analog-to-digital converting device of claim 66, further comprising:
  a delay circuit, arranged to generate a delayed digital signal by delaying the digital output signal;
  wherein the first digital-to-analog converter generates the first analog feedback signal according to the delayed digital signal.

68. The analog-to-digital converting device of claim 66, wherein the integrator comprises:
  a resistor, having a first terminal for receiving the analog input signal;
  an operational amplifier, having an input terminal coupled to a second terminal of the resistor, and an output terminal for outputting the integrating signal; and
  a capacitor, having a first terminal coupled to the input terminal of the operational amplifier and a second terminal coupled to the output terminal of the operational amplifier;
  wherein the first analog feedback signal is feedback to the input terminal of the operational amplifier.

69. The analog-to-digital converting device of claim 68, wherein the resistor is an adjustable resistor.

70. The analog-to-digital converting device of claim 66, wherein the integrator comprises:
  an operational amplifier, having an input terminal for receiving the analog input signal, and an output terminal for outputting the integrating signal; and
  a capacitor, having a first terminal coupled to the input terminal of the operational amplifier and a second terminal coupled to the output terminal of the operational amplifier;
  wherein the first analog feedback signal is feedback to the input terminal of the operational amplifier.

71. The analog-to-digital converting device of claim 66, wherein the low-pass filter comprises:
  a plurality of LR (Inductor-resistor) filters, the plurality of LR filters are connected in series in which the first LR filter of the plurality of LR filters is arranged to receive the integrating signal and the last LR filter of the plurality of LR filters is arranged to output the first filtered signal.

72. The analog-to-digital converting device of claim 66, wherein the low-pass filter comprises:
  a plurality of LC (Inductor-capacitor) filters, the plurality of LC filters are connected in series in which the first LC filter of the plurality of LC filters is arranged to receive the integrating signal and the last LC filter of the plurality of LC filters is arranged to output the first filtered signal.

73. The analog-to-digital converting device of claim 72, wherein at least one RC filter of the plurality of RC filters further comprises:
  a buffer, for outputting a post-filtering signal to a next RC filter of the plurality of RC filters.

74. The analog-to-digital converting device of claim 72, further comprising:
  a plurality of second digital-to-analog converters, for generating a plurality of feedback signals according to the digital output signal respectively;
  wherein the plurality of feedback signals are feedback into the plurality of the RC filters respectively.

75. The analog-to-digital converting device of claim 66, wherein the analog-to-digital converter (ADC) is a flash ADC, a successive approximate ADC, or a continuous-time delta-sigma ADC.

76. The analog-to-digital converting device of claim 66, wherein the analog-to-digital converter comprises:
  a loop filter, arranged to generate a second filtered signal according to the first filtered signal and a second analog feedback signal;
  a quantizer, arranged to generate the digital output signal at least according to the second filtered signal; and
  a second digital-to-analog converter, arranged to generate the second analog feedback signal according to the digital output signal.

77. The analog-to-digital converting device of claim 76, wherein the analog-to-digital converter further comprises:
  a first delay circuit, arranged to generate a first delayed digital signal by delaying the digital output signal;
  wherein the second digital-to-analog converter generates the second analog feedback signal according to the first delayed digital signal.

78. The analog-to-digital converting device of claim 77, wherein the analog-to-digital converter further comprises:
  a second delay circuit, arranged to generate a second delayed digital signal by delaying the first delayed digital signal; and
  a third digital-to-analog converter, arranged to generate a third analog feedback signal according to the second delayed digital signal;
  wherein the third analog feedback signal is feedback to the loop filter, and the loop filter generates the second filtered signal according to the first filtered signal, the second analog feedback signal, and the third analog feedback signal.

79. The analog-to-digital converting device of claim 77, wherein the analog-to-digital converter further comprises:
  a third digital-to-analog converter, arranged to generate a third analog feedback signal according to the first delayed digital signal;
  wherein the third analog feedback signal is feedback to the quantizer, and the quantizer is arranged to generate the digital output signal according to the second filtered signal and the third analog feedback signal.

80. The analog-to-digital converting device of claim 77, wherein the analog-to-digital converter further comprises:
  a second delay circuit, arranged to generate a second delayed digital signal by delaying the digital output signal;
  a third digital-to-analog converter, arranged to generate a third analog feedback signal according to the second delayed digital signal;
  wherein the third analog feedback signal is feedback to the quantizer, and the quantizer is arranged to generate the digital output signal according to the second filtered signal and the third analog feedback signal.

81. An analog-to-digital converting device, comprising:
an integrator, arranged to generate an integrating signal according to an analog input signal and a first analog feedback signal;
a low-pass filter, arranged to generate a first filtered signal according to the integrating signal;
an analog-to-digital converter, arranged to generate a digital output signal according to the first filtered signal, wherein the analog-to-digital converter comprises:
  a loop filter, arranged to generate a second filtered signal according to the first filtered signal and a second analog feedback signal;
  a quantizer, arranged to generate the digital output signal at least according to the second filtered signal; and
  a second digital-to-analog converter, arranged to generate the second analog feedback signal according to the digital output signal; and
a first digital-to-analog converter, arranged to generate the first analog feedback signal according to the digital output signal.

82. The analog-to-digital converting device of claim 81, further comprising:
a delay circuit, arranged to generate a delayed digital signal by delaying the digital output signal;
wherein the first digital-to-analog converter generates the first analog feedback signal according to the delayed digital signal.

83. The analog-to-digital converting device of claim 81, wherein the integrator comprises:
a resistor, having a first terminal for receiving the analog input signal;
an operational amplifier, having an input terminal coupled to a second terminal of the resistor, and an output terminal for outputting the integrating signal; and
a capacitor, having a first terminal coupled to the input terminal of the operational amplifier and a second terminal coupled to the output terminal of the operational amplifier;
wherein the first analog feedback signal is feedback to the input terminal of the operational amplifier.

84. The analog-to-digital converting device of claim 83, wherein the resistor is an adjustable resistor.

85. The analog-to-digital converting device of claim 81, wherein the integrator comprises:
an operational amplifier, having an input terminal for receiving the analog input signal, and an output terminal for outputting the integrating signal; and
a capacitor, having a first terminal coupled to the input terminal of the operational amplifier and a second terminal coupled to the output terminal of the operational amplifier;
wherein the first analog feedback signal is feedback to the input terminal of the operational amplifier.

86. The analog-to-digital converting device of claim 81, wherein the low-pass filter comprises:
a plurality of LR (Inductor-resistor) filters, the plurality of LR filters are connected in series in which the first LR filter of the plurality of LR filters is arranged to receive the integrating signal and the last LR filter of the plurality of LR filters is arranged to output the first filtered signal.

87. The analog-to-digital converting device of claim 81, wherein the low-pass filter comprises:
a plurality of LC (Inductor-capacitor) filters, the plurality of LC filters are connected in series in which the first LC filter of the plurality of LC filters is arranged to receive the integrating signal and the last LC filter of the plurality of LC filters is arranged to output the first filtered signal.

88. The analog-to-digital converting device of claim 81, wherein the low-pass filter comprises:
a plurality of RC (Resistor-capacitor) filters, the plurality of RC filters are connected in series in which the first RC filter of the plurality of RC filters is arranged to receive the integrating signal and the last RC filter of the plurality of RC filters is arranged to output the first filtered signal.

89. The analog-to-digital converting device of claim 88, wherein at least one RC filter of the plurality of RC filters further comprises:
a buffer, for outputting a post-filtering signal to a next RC filter of the plurality of RC filters.

90. The analog-to-digital converting device of claim 88, further comprising:
a plurality of second digital-to-analog converters, for generating a plurality of feedback signals according to the digital output signal respectively;
wherein the plurality of feedback signals are feedback into the plurality of the RC filters respectively.

91. The analog-to-digital converting device of claim 81, wherein the analog-to-digital converter (ADC) is a flash ADC, a successive approximate ADC, or a continuous-time delta-sigma ADC.

92. The analog-to-digital converting device of claim 81, wherein the analog-to-digital converter further comprises:
a first delay circuit, arranged to generate a first delayed digital signal by delaying the digital output signal;
wherein the second digital-to-analog converter generates the second analog feedback signal according to the first delayed digital signal.

93. The analog-to-digital converting device of claim 92, wherein the analog-to-digital converter further comprises:
a second delay circuit, arranged to generate a second delayed digital signal by delaying the first delayed digital signal; and
a third digital-to-analog converter, arranged to generate a third analog feedback signal according to the second delayed digital signal;
wherein the third analog feedback signal is feedback to the loop filter, and the loop filter generates the second filtered signal according to the first filtered signal, the second analog feedback signal, and the third analog feedback signal.

94. The analog-to-digital converting device of claim 92, wherein the analog-to-digital converter further comprises:
a third digital-to-analog converter, arranged to generate a third analog feedback signal according to the first delayed digital signal;
wherein the third analog feedback signal is feedback to the quantizer, and the quantizer is arranged to generate the digital output signal according to the second filtered signal and the third analog feedback signal.

95. The analog-to-digital converting device of claim 92, wherein the analog-to-digital converter further comprises:
a second delay circuit, arranged to generate a second delayed digital signal by delaying the digital output signal;
a third digital-to-analog converter, arranged to generate a third analog feedback signal according to the second delayed digital signal;
wherein the third analog feedback signal is feedback to the quantizer, and the quantizer is arranged to generate the digital output signal according to the second filtered signal and the third analog feedback signal.

* * * * *